United States Patent
Hashiguchi

(10) Patent No.: US 11,735,842 B2
(45) Date of Patent: Aug. 22, 2023

(54) ELECTRICAL COMPONENT

(71) Applicant: JAPAN AVIATION ELECTRONICS INDUSTRY, LIMITED, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 79 days.

(21) Appl. No.: 17/532,506

(22) Filed: Nov. 22, 2021

(65) Prior Publication Data

US 2022/0209439 A1 Jun. 30, 2022

(30) Foreign Application Priority Data

Dec. 25, 2020 (JP) ................................ 2020-216049

(51) Int. Cl.
*H01R 12/57* (2011.01)
*H01R 12/58* (2011.01)

(52) U.S. Cl.
CPC ........... *H01R 12/585* (2013.01); *H01R 12/57* (2013.01)

(58) Field of Classification Search
CPC ...... H01R 12/585; H01R 12/57; H01R 12/58; H01R 12/7011; H01R 12/716; H05K 3/3447; H05K 2201/10189; H05K 2201/10787; H05K 2201/10818; H05K 3/308; H05K 1/184
See application file for complete search history.

(56) References Cited

U.S. PATENT DOCUMENTS

| | | | |
|---|---|---|---|
| 5,411,404 A * | 5/1995 | Korsunsky | H05K 7/12 439/108 |
| 6,793,541 B2 | 9/2004 | Yamaguchi et al. | |
| 7,247,050 B1 * | 7/2007 | Minich | H01R 12/58 439/82 |
| 7,252,532 B2 | 8/2007 | Sato | |

(Continued)

FOREIGN PATENT DOCUMENTS

| | | |
|---|---|---|
| JP | 2003132971 A | 5/2003 |
| JP | 2007059227 A | 3/2007 |

(Continued)

OTHER PUBLICATIONS

Taiwanese Office Action (and English translation thereof) dated Aug. 18, 2022, issued in counterpart Taiwanese Application No. 110141282.

*Primary Examiner* — Truc T Nguyen

(74) *Attorney, Agent, or Firm* — Holtz, Holtz & Volek PC

(57) ABSTRACT

An electrical component comprises a main body, a fulcrum portion and at least two terminals including a first terminal and a second terminal. Each of the terminals has a first portion and a second portion. The first portion of one of the first terminal and the second terminal is brought into contact with a circuit board when the main body is tilted relative to the circuit board with the fulcrum portion, which acts as a fulcrum, under an insertion state where the terminals are inserted into through-holes, respectively, while none of the terminals are soldered thereto. When the main body is tilted relative to the circuit board with the fulcrum portion, which acts as the fulcrum, under the insertion state, the second portion of one of the first terminal and the second terminal is brought into contact with the circuit board to regulate an excessive tilt of the main body.

9 Claims, 17 Drawing Sheets

(56) References Cited

U.S. PATENT DOCUMENTS

| 7,682,190 | B2* | 3/2010 | Huang | H01R 12/7064 |
| | | | | 439/571 |
| 9,799,995 | B1* | 10/2017 | Zhou | H01R 13/629 |
| 2019/0363500 | A1* | 11/2019 | Sahm | H01R 43/0263 |
| 2020/0194915 | A1* | 6/2020 | Kawashima | H01R 12/57 |
| 2022/0294134 | A1* | 9/2022 | Kishibata | H01R 12/7064 |

FOREIGN PATENT DOCUMENTS

| JP | 2012099440 A | 5/2012 |
| JP | 2017022043 A | 1/2017 |
| JP | 2017041576 A | 2/2017 |
| JP | 2017157718 A | 9/2017 |
| JP | 2018078078 A | 5/2018 |
| JP | 2019212498 A | 12/2019 |

* cited by examiner

ELECTRICAL COMPONENT

CROSS REFERENCE TO RELATED APPLICATIONS

This application is based on and claims priority under 35 U.S.C. § 119 to Japanese Patent Application No. JP2020-216049 filed Dec. 25, 2020, the contents of which are incorporated herein in their entirety by reference.

BACKGROUND OF THE INVENTION

This invention relates to an electrical component mountable on a circuit board.

Referring to FIG. 34, JPA2007-59227 (Patent Document 1) discloses an assembly 900 including a connector 905, or an electrical component 905 of this type. The assembly 900 comprises the electrical component 905 and a circuit board 950. The circuit board 905 has through-holes 951, 952 and 953. The electrical component 905 is mountable on the circuit board 950. The electrical component 905 comprises a housing 910, a plurality of contacts (not shown) and a shell 930. The housing 910 is formed with first bosses 911. The shell 930 is formed with a second boss 932 and third bosses 933. When the electrical component 905 is mounted on the circuit board 950, the assembly 900 is configured as follows: the first bosses 911 of the housing 910 are inserted into the through-holes 951, respectively, of the circuit board 950; the second boss 932 of the shell 930 is inserted into the through-hole 952; and the third bosses 933 of the shell 930 are inserted into the through-holes 953, respectively, of the circuit board 950.

When the electrical component 905 is tilted relative to the circuit board 950, the first boss 911 abuts against an inside of the corresponding through-hole 951 of the circuit board 950 and the second boss 932 abuts against an inside of through-hole 952 of the circuit board 950. Accordingly, an excessive tilt of the electrical component 905 relative to the circuit board 950 is regulated.

There is a requirement for an electrical component such as the electrical component of Patent Document 1 to more reliably prevent its excessive tilt relative to a circuit board.

SUMMARY OF THE INVENTION

It is therefore an object of the present invention to provide an electrical component having a new structure which more reliably prevents an excessive tilt of the electrical component relative to a circuit board.

One aspect of the present invention provides an electrical component mountable on a circuit board having at least two through-holes. The electrical component comprises a main body, a fulcrum portion and at least two terminals. The fulcrum portion is brought into contact with the circuit board when the electrical component is mounted on the circuit board. When the main body is mounted on the circuit board, the at least two terminals are inserted into the at least two through-holes, respectively, and are soldered thereto. The at least two terminals include a first terminal and a second terminal. The first terminal and the second terminal are positioned apart from each other in a predetermined direction. Each of the terminals has a first portion and a second portion. The first portion has an outer edge and an inner edge in the predetermined direction. The outer edge of the first portion extends downward in an up-down direction perpendicular to the predetermined direction from the main body and then extends downward in the up-down direction and inward in the predetermined direction. The outer edge of the first portion has an upper end in the up-down direction. The upper end of the outer edge of the first portion is positioned at an outermost location of the outer edge of the first portion in the predetermined direction. The first portion of one of the first terminal and the second terminal is brought into contact with the circuit board when the main body is tilted relative to the circuit board with the fulcrum portion, which acts as a fulcrum, under an insertion state where the terminals are inserted into the through-holes, respectively, while none of the terminals are soldered thereto. The second portion extends downward in the up-down direction from the first portion. When the main body is tilted relative to the circuit board with the fulcrum portion, which acts as the fulcrum, under the insertion state, the second portion of one of the first terminal and the second terminal is brought into contact with the circuit board to regulate an excessive tilt of the main body.

The electrical component of the present invention is configured as follows: the first portion of one of the first terminal and the second terminal is brought into contact with the circuit board when the main body is tilted relative to the circuit board with the fulcrum portion, which acts as the fulcrum, under the insertion state where the terminals are inserted into the through-holes, respectively, while none of the terminals are soldered thereto; and, when the main body is tilted relative to the circuit board with the fulcrum portion, which acts as the fulcrum, under the insertion state, the second portion of one of the first terminal and the second terminal is brought into contact with the circuit board to regulate the excessive tilt of the main body. Accordingly, the electrical component of the present invention more reliably prevents its excessive tilt relative to a circuit board when the main body is tilted relative to the circuit board under the insertion state. This is particularly effective when the terminals of the electrical component of the present invention are reflow-soldered to a circuit board.

An appreciation of the objectives of the present invention and a more complete understanding of its structure may be had by studying the following description of the preferred embodiment and by referring to the accompanying drawings.

Figure 1:
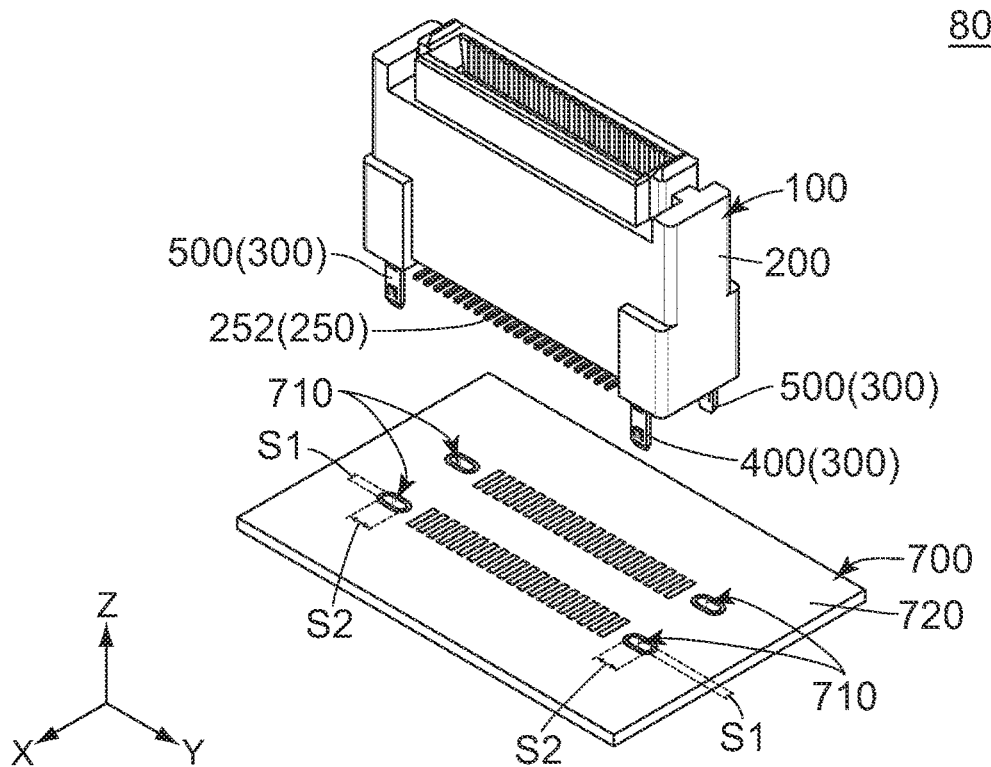
FIG. 1 is an upper, perspective view showing an assembly according to a first embodiment of the present invention. In the figure, none of terminals of an electrical component are inserted into through-holes of a circuit board.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Figure 2:
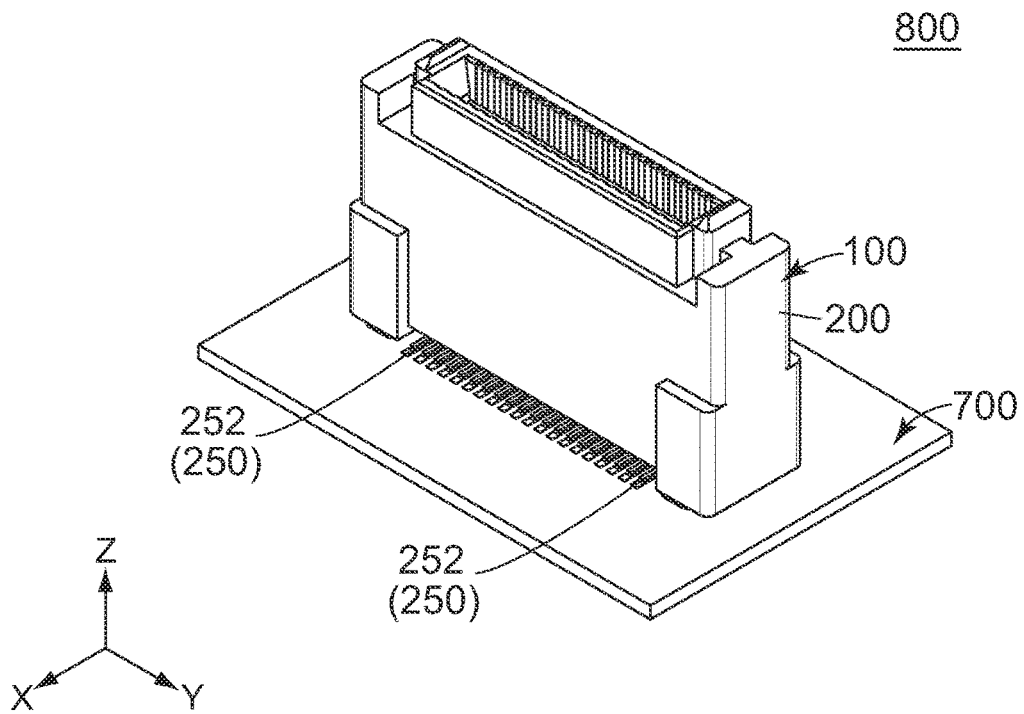
FIG. 2 is an upper, perspective view showing the assembly of FIG. 1. In the figure, the terminals are inserted into the through-holes, respectively, while none of the terminals are soldered thereto.
Figure 3:
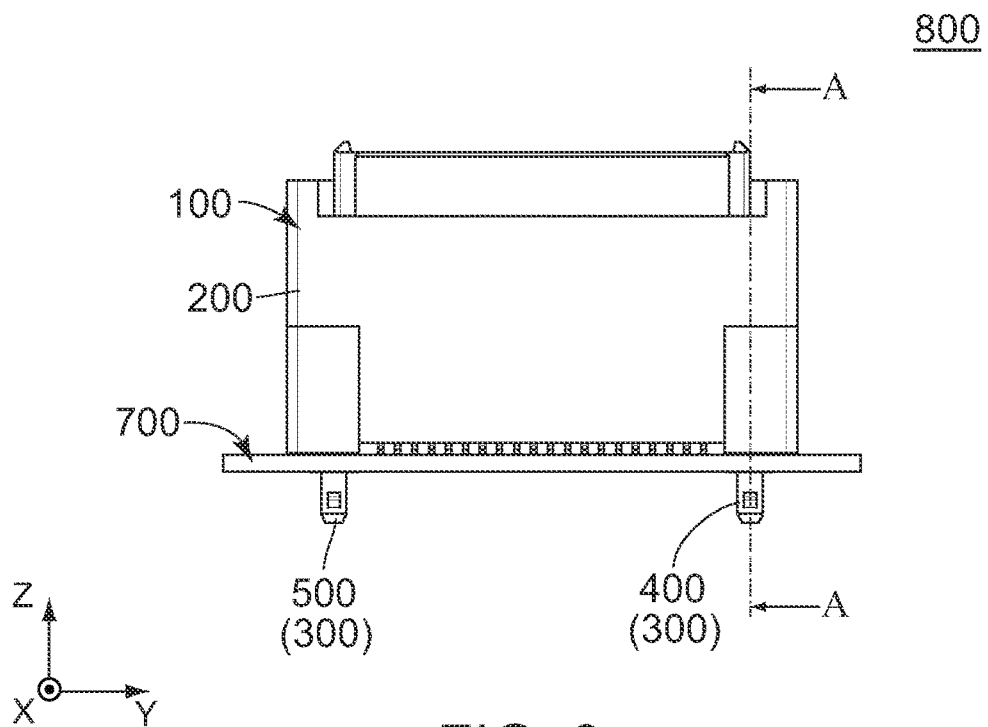
FIG. 3 is a front view showing the assembly of FIG. 2.

As shown in FIG. 2, an assembly 800 according to a first embodiment of the present invention comprises a circuit board 700 and an electrical component 100.

Figure 4:
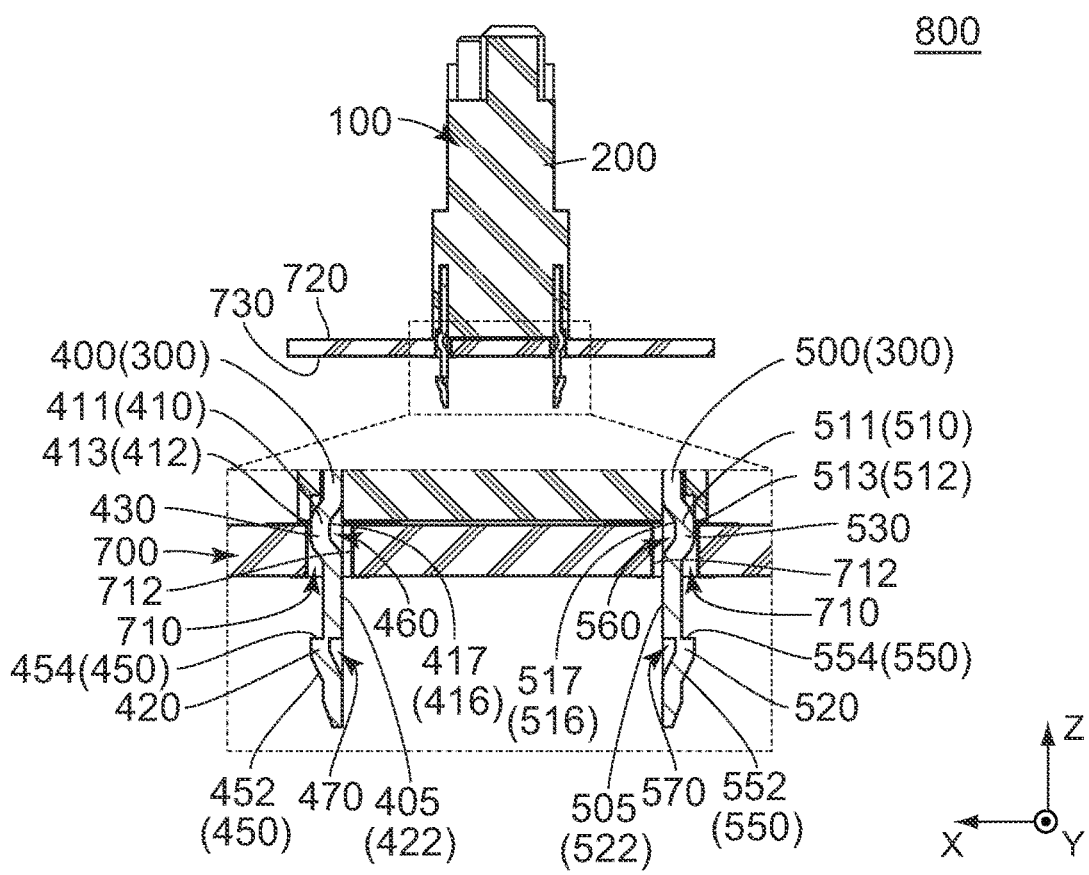
FIG. 4 is a cross-sectional view showing the assembly of FIG. 3, taken along line A-A. In the figure, parts of the electrical component and the circuit board are illustrated enlarged.
Figure 5:
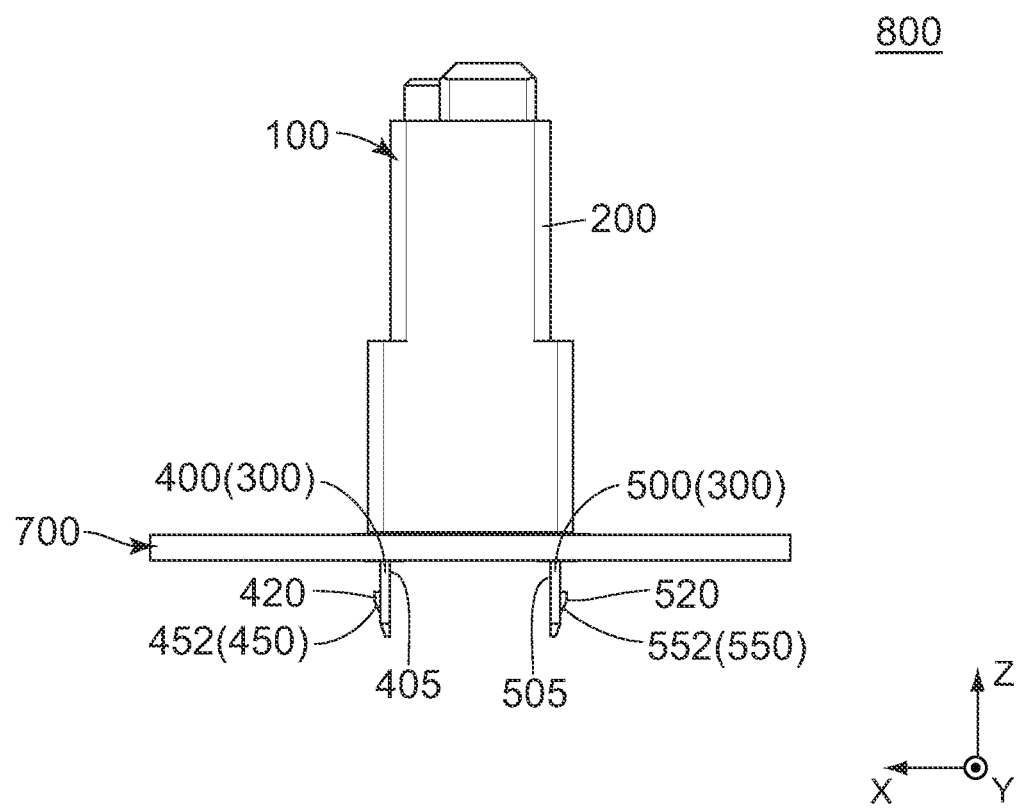
FIG. 5 is a side view showing the assembly of FIG. 2.

As shown in FIGS. 1 and 4, the circuit board 700 of the present embodiment has a plurality of through-holes 710, an upper surface 720 and a lower surface 730. However, the present invention is not limited thereto. Specifically, the circuit board 700 should have at least two through-holes 710.

As shown in FIG. 4, each of the through-holes 710 of the present embodiment pierces the circuit board 700 in an up-down direction. In the present embodiment, the up-down direction is a Z-direction. Specifically, it is assumed that upward is a positive Z-direction while downward is a negative Z-direction.

As shown in FIG. 1, the upper surface 720 of the present embodiment faces upward in the up-down direction. The upper surface 720 is perpendicular to the up-down direction. The upper surface 720 is positioned above the lower surface 730 in the up-down direction.

As shown in FIG. 4, the lower surface 730 of the present embodiment faces downward in the up-down direction. The lower surface 730 is perpendicular to the up-down direction.

Figure 11:
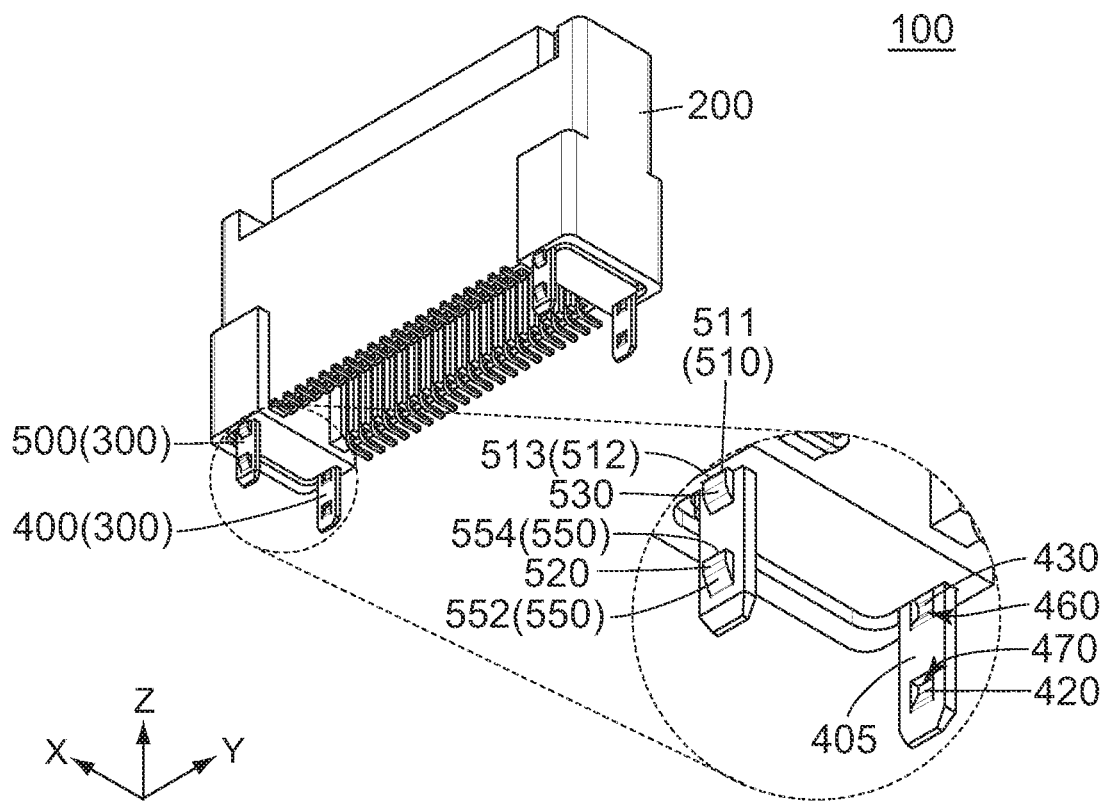
FIG. 11 is a lower, perspective view showing the electrical component of FIG. 9. In the figure, parts of the main body and the terminals are illustrated enlarged.

As shown in FIG. 2, the electrical component 100 of the present embodiment is mounted on the circuit board 700. The electrical component 100 of the present embodiment is a so-called connector. However, the present invention is not limited thereto. The electrical component 100 may be an electrical component other than the connector. The electrical component 100 extends long in a right-left direction perpendicular to the up-down direction. The electrical component 100 extends short in a predetermined direction perpendicular to both the up-down direction and the right-left direction. In the present embodiment, the right-left direction is a Y-direction. In the present embodiment, the predetermined direction is an X-direction. The predetermined direction is also referred to as a front-rear direction. It is assumed that forward is a positive X-direction while rearward is a negative X-direction. As shown in FIGS. 1 and 11, the electrical component 100 comprises a main body 200, a plurality of terminals 300 and a plurality of additional terminals 250. More specifically, the electrical component 100 comprises the main body 200, four of the terminals 300, the plurality of additional terminals 250. However, the present invention is not limited thereto. Specifically, the electrical component 100 should comprises the main body 200 and at least two terminals 300.

Referring to FIG. 1, the main body 200 of the present embodiment is made of insulator. The main body 200 extends long in the right-left direction. The main body 200 extends short in the predetermined direction.

Referring to FIG. 4, each of the terminals 300 of the present embodiment is made of metal. The terminals 300 are held by the main body 200. When the main body 200 is mounted on the circuit board 700, the terminals 300 are inserted into the through-holes 710, respectively, and are soldered thereto. The terminals 300 include first terminals 400 and second terminals 500. More specifically, the terminals 300 include two of the first terminals 400 and two of the second terminals 500. The first terminal 400 and one of the second terminals 500 are positioned apart from each other in the predetermined direction. The first terminal 400 and the second terminal 500 have shapes same as each other. The two first terminals 400 correspond to the two second terminals 500, respectively. Each of the first terminals 400 faces the second terminal 500 corresponding thereto in the predetermined direction. Each of the first terminals 400 is positioned around an outer end of the main body 200 in the predetermined direction. Each of the second terminals 500 is positioned around the outer end of the main body 200 in the predetermined direction. The two first terminals 400 are positioned around opposite ends, respectively, of the main body 200 in the right-left direction. The two second terminals 500 are positioned around the opposite ends, respectively, of the main body 200 in the right-left direction. Referring to FIGS. 1 and 11, in the predetermined direction, each of the terminals 300 has a size smaller than a size S1 of the through-hole 710 corresponding thereto. In the right-left direction, each of the terminals 300 has a size smaller than a size S2 of the through-hole 710 corresponding thereto.

As shown in FIG. 4, each of the first terminals 400 has a first portion 410 and a second portion 420. Each of the second terminals 500 has a first portion 510 and a second portion 520. In other words, each of the terminals 300 has the first portion 410, 510 and the second portion 420, 520.

As shown in FIG. 4, the first portion 410 of the first terminal 400 has an outer edge 412 and an inner edge 416 in the predetermined direction. The outer edge 412 of the first portion 410 extends downward in the up-down direction perpendicular to the predetermined direction from the main body 200 and then extends downward in the up-down direction and inward in the predetermined direction. An upper end 413 of the outer edge 412 of the first portion 410 is positioned at the outermost location of the outer edge 412 of the first portion 410 in the predetermined direction.

As shown in FIG. 4, in the predetermined direction, an upper end 417 of the inner edge 416 of the first portion 410 of the first terminal 400 is positioned outward beyond an innermost portion 405 which is positioned at the innermost location of the first terminal 400. Under an insertion state where the terminals 300 are inserted into the through-holes 710, respectively, while none of the terminals 300 are soldered thereto, the upper end 417 of the inner edge 416 of the first portion 410 is spaced apart from an inner wall 712 of the through-hole 710 in the predetermine direction.

Figure 9:
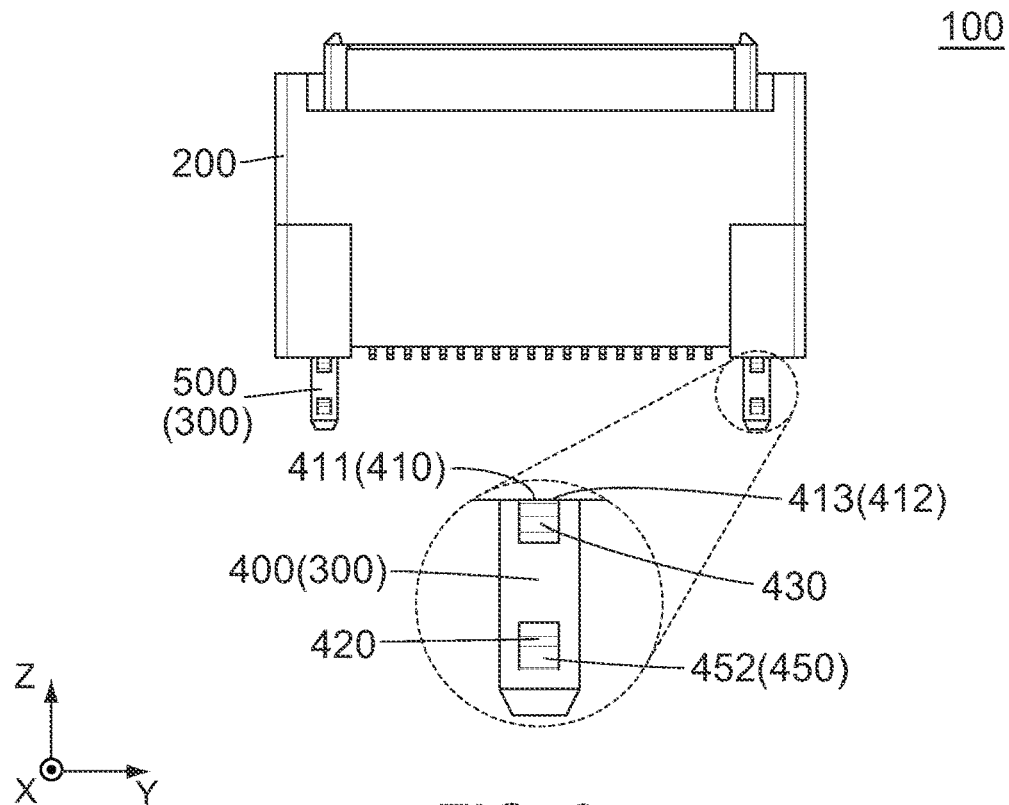
FIG. 9 is a front view showing the electrical component which is included in the assembly of FIG. 1. In the figure, parts of a main body and the terminal are illustrated enlarged.
Figure 10:
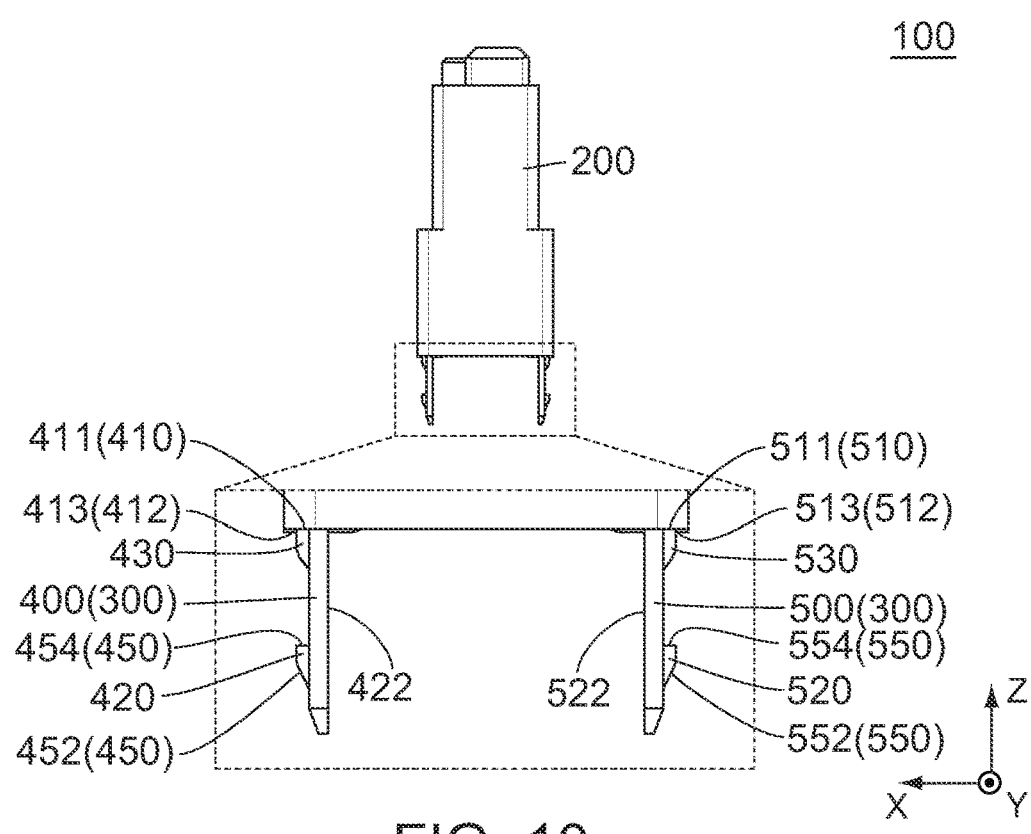
FIG. 10 is a side view showing the electrical component of FIG. 9. In the figure, parts of the main body and the terminals are illustrated enlarged.

Referring to FIGS. 1 and 9, in the predetermined direction, the first portion 410 of the first terminal 400 has a size smaller than the size S1 of the through-hole 710 corresponding thereto. In the right-left direction, the first portion 410 of the first terminal 400 has a size smaller than the size S2 of the through-hole 710 corresponding thereto.

As shown in FIG. 4, the first portion 510 of the second terminal 500 has an outer edge 512 and an inner edge 516 in the predetermined direction. The outer edge 512 of the first portion 510 extends downward in the up-down direction perpendicular to the predetermined direction from the main body 200 and then extends downward in the up-down direction and inward in the predetermined direction. An upper end 513 of the outer edge 512 of the first portion 510 is positioned at the outermost location of the outer edge 512 of the first portion 510 in the predetermined direction.

As shown in FIG. 4, in the predetermined direction, an upper end 517 of the inner edge 516 of the first portion 510 of the second terminal 500 is positioned outward beyond an innermost portion 505 which is positioned at the innermost location of the second terminal 500. Under the insertion state, the upper end 517 of the inner edge 516 of the first portion 510 is spaced apart from the inner wall 712 of the through-hole 710 in the predetermine direction.

Referring to FIGS. 1 and 11, in the predetermined direction, the first portion 510 of the second terminal 500 has a size smaller than the size S1 of the through-hole 710 corresponding thereto. In the right-left direction, the first portion 510 of the second terminal 500 has a size smaller than the size S2 of the through-hole 710 corresponding thereto.

Referring to FIGS. 1 and 11, in the predetermined direction, the second portion 420 of the first terminal 400 has a size smaller than the size S1 of the through-hole 710 corresponding thereto. In the right-left direction, the second portion 420 of the first terminal 400 has a size smaller than the size S2 of the through-hole 710 corresponding thereto.

Referring to FIGS. 1 and 11, in the predetermined direction, the second portion 520 of the second terminal 500 has a size smaller than the size S1 of the through-hole 710 corresponding thereto. In the right-left direction, the second portion 520 of the second terminal 500 has a size smaller than the size S2 of the through-hole 710 corresponding thereto.

As shown in FIG. 4, the second portion 420 of the present embodiment has a lower protrusion 450 and a coupling portion 422. The second portion 520 has a lower protrusion 550 and a coupling portion 522. In other words, the second portion 420, 520 has the lower protrusion 450, 550 and the coupling portion 422, 522.

As shown in FIG. 4, the first terminal 400 of the present embodiment has the single lower protrusion 450. The lower protrusion 450 protrudes outward in the predetermined direction. More specifically, the lower protrusion 450 is a projection which has a peaked shape and is formed by half-punching. The lower protrusion 450 is positioned downward of the coupling portion 422 in the up-down direction.

As shown in FIG. 4, the second terminal 500 of the present embodiment has the single lower protrusion 550. The lower protrusion 550 protrudes outward in the predetermined direction. More specifically, the lower protrusion 550 is a projection which has a peaked shape and is formed by half-punching. The lower protrusion 550 is positioned downward of the coupling portion 522 in the up-down direction. The lower protrusion 450 of the first terminal 400 and the lower protrusion 550 of the second terminal 500 corresponding thereto are positioned at positions same as each other in the up-down direction.

As shown in FIG. 4, the lower protrusion 450 has a guide portion 452 and an end surface 454. The lower protrusion 550 has a guide portion 552 and an end surface 554.

As shown in FIG. 4, the guide portion 452 of the present embodiment intersects with both the predetermined direction and the up-down direction. The guide portion 452 faces outward in the predetermined direction and downward in the up-down direction.

As shown in FIG. 4, the guide portion 552 of the present embodiment intersects with both the predetermined direction and the up-down direction. The guide portion 552 faces outward in the predetermined direction and downward in the up-down direction.

As shown in FIG. 4, the end surface 454 of the present embodiment faces upward in the up-down direction. The end surface 454 is a plane intersecting with the up-down direction. More specifically, the end surface 454 is the plane perpendicular to the up-down direction. The end surface 454 defines an upper end of the lower protrusion 450 in the up-down direction.

As shown in FIG. 4, the end surface 554 of the present embodiment faces upward in the up-down direction. The end surface 554 is a plane intersecting with the up-down direction. More specifically, the end surface 554 is the plane perpendicular to the up-down direction. The end surface 554 defines an upper end of the lower protrusion 550 in the up-down direction.

As shown in FIG. 4, the coupling portion 422 of the present embodiment defines an upper end of the second portion 420 in the up-down direction. The coupling portion 422 is coupled with the first portion 410 in the up-down direction. The coupling portion 422 couples the first portion 410 and the lower protrusion 450 with each other.

As shown in FIG. 4, the coupling portion 522 of the present embodiment defines an upper end of the second portion 520 in the up-down direction. The coupling portion 522 is coupled with the first portion 510 in the up-down direction. The coupling portion 522 couples the first portion 510 and the lower protrusion 550 with each other.

As shown in FIG. 4, the first terminal 400 further has an upper bulge 430. The second terminal 500 further has an upper bulge 530. In other words, the terminal 300 has the upper bulge 430, 530.

As shown in FIG. 4, the upper bulge 430 of the present embodiment is bulged outward in the predetermined direction. The upper bulge 430 forms an upper end 411 of the first portion 410.

As shown in FIG. 4, the upper bulge 530 of the present embodiment is bulged outward in the predetermined direction. The upper bulge 530 forms an upper end 511 of the first portion 510. The upper bulge 430 of the first terminal 400 and the upper bulge 530 of the second terminal 500 corresponding thereto are positioned at positions same as each other in the up-down direction.

As shown in FIG. 4, the first terminal 400 further has a recess 460 and a depression 470. The second terminal 500 further has a recess 560 and a depression 570. In other words, the terminal 300 further has the recess 460, 560 and the depression 470, 570.

As shown in FIG. 4, the recess 460 is positioned at a position same as a position of the first portion 410 in the up-down direction. The recess 460 is positioned inward in the predetermined direction beyond the upper end 417. The recess 460 is recessed toward the outside of the electrical component 100 in the predetermined direction.

As shown in FIG. 4, the recess 560 is positioned at a position same as a position of the first portion 510 in the up-down direction. The recess 560 is positioned inward in the predetermined direction beyond the upper end 517. The recess 560 is recessed toward the outside of the electrical component 100 in the predetermined direction.

As shown in FIG. 4, the depression 470 is positioned at a position same as a position of the lower protrusion 450 in the up-down direction. The depression 470 is positioned inward in the predetermined direction beyond the lower protrusion 450. The depression 470 is recessed toward the outside of the electrical component 100 in the predetermined direction.

As shown in FIG. 4, the depression 570 is positioned at a position same as a position of the lower protrusion 550 in the up-down direction. The depression 570 is positioned inward in the predetermined direction beyond the lower protrusion 550. The depression 570 is recessed toward the outside of the electrical component 100 in the predetermined direction.

Referring to FIG. 1, each of the additional terminals 250 of the present embodiment is made of metal. Each of the additional terminals 250 is an SMT (surface mount technology) terminal which is configured to be fixed on the surface of the circuit board 700 by soldering or the like. The additional terminals 250 are held by the main body 200. Each of the additional terminals 250 has a fulcrum portion 252. The electrical component 100 comprises the main body 200, the fulcrum portions 252 and the terminals 300. However, the present invention is not limited thereto. Specifically, the electrical component 100 should comprise the main body 200, the fulcrum portion 252 and at least two terminals 300.

Figure 6:
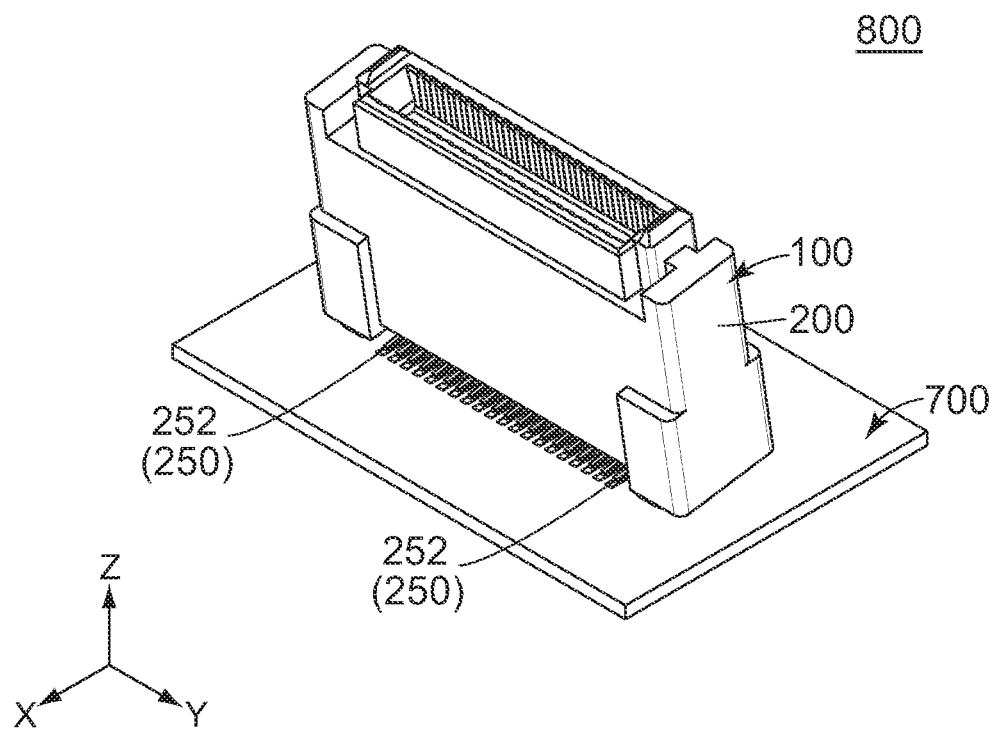
FIG. 6 is another upper, perspective view showing the assembly of FIG. 2, wherein: each of the terminals is inserted into the corresponding through-hole while none of the terminals are soldered thereto; and the electrical component is tilted relative to the circuit board.
Figure 7:
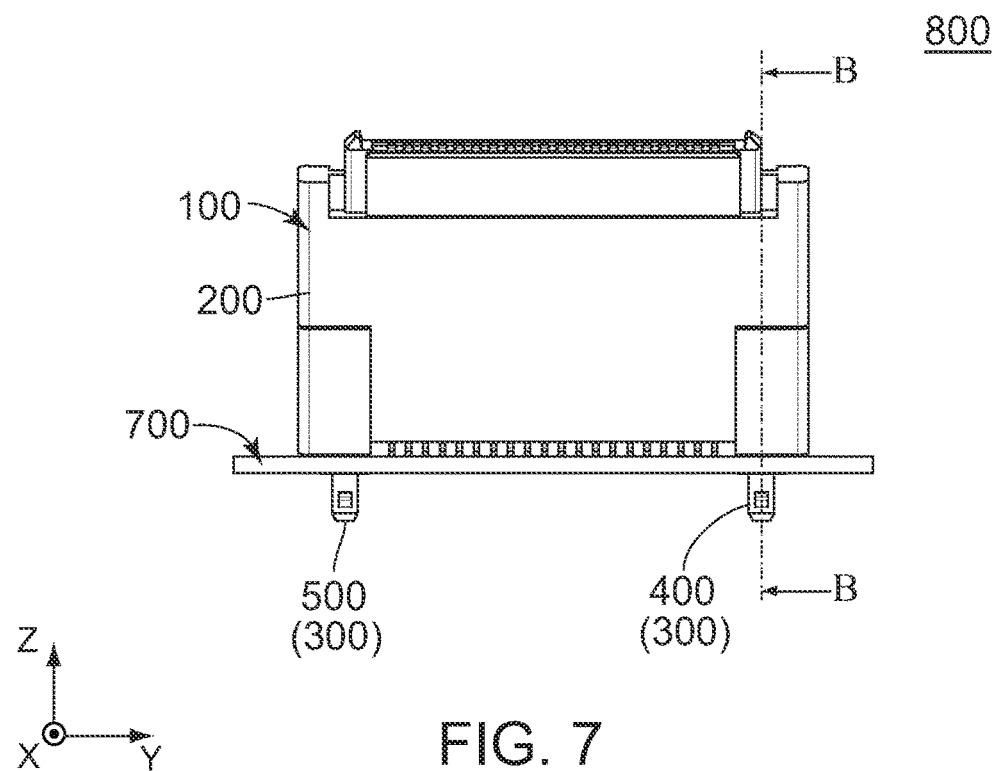
FIG. 7 is a front view showing the assembly of FIG. 6.
Figure 8:
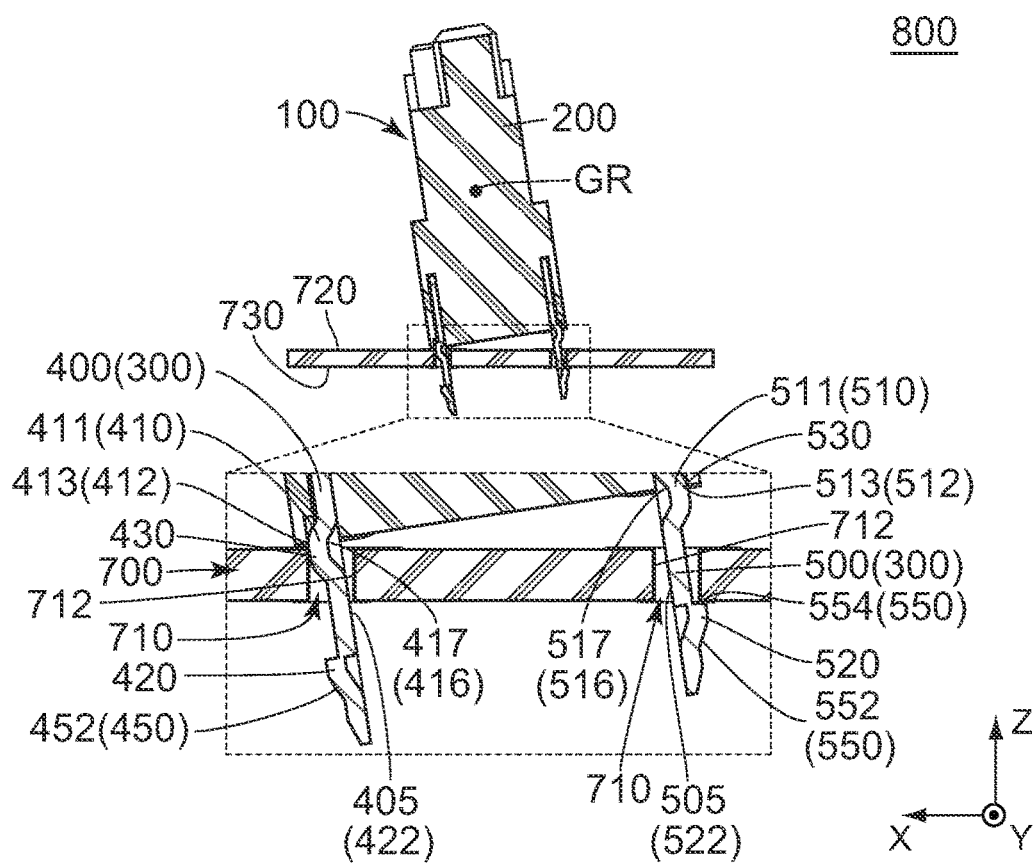
FIG. 8 is a cross-sectional view showing the assembly of FIG. 7, taken along line B-B. In the figure, parts of the electrical component and the circuit board are illustrated enlarged.

Referring to FIG. 2, the fulcrum portion 252 of the present embodiment is positioned at an outer end of the additional terminal 250 in the predetermined direction. The fulcrum portion 252 is brought into contact with the circuit board 700 when the electrical component 100 is mounted on the circuit board 700. Referring to FIGS. 6 and 8, the fulcrum portion 252 acts as a fulcrum when the main body 200 is tilted relative to the circuit board 700 under the insertion state where each of the terminals 300 is inserted into the through-hole 710 corresponding thereto while none of the terminals 300 are soldered thereto.

Hereinafter, explanation will be made about states of members of the electrical component 100 when the main body 200 is tilted relative to the circuit board 700 under the insertion state by some external factor.

Referring to FIGS. 6 and 8, the first portion 410 of the first terminal 400 is brought into contact with the circuit board 700 when the main body 200 is tilted relative to the circuit board 700 with the fulcrum portion 252, which acts as the fulcrum, under the insertion state. More specifically, the first portion 410 is brought into contact with the inner wall 712 of the through-hole 710 when the main body 200 is tilted relative to the circuit board 700 with the fulcrum portion 252, which acts as the fulcrum, under the insertion state so that the main body 200 intersects with both the up-down direction and the predetermined direction. However, the present invention is not limited thereto. Specifically, the first portion 510 of the second terminal 500 may be brought into contact with the circuit board 700 when the main body 200 is tilted relative to the circuit board 700 with the fulcrum portion 252, which acts as the fulcrum, under the insertion state. In other words, the electrical component 100 should be configured so that the first portion 410, 510 of one of the first terminal 400 and the second terminal 500 is brought into contact with the circuit board 700 when the main body 200 is tilted relative to the circuit board 700 with the fulcrum portion 252, which acts as the fulcrum, under the insertion state where each of the terminals 300 is inserted into the through-hole 710 corresponding thereto while none of the terminals 300 are soldered thereto.

Referring to FIGS. 6 and 8, when the main body 200 is tilted relative to the circuit board 700 with the fulcrum portion 252, which acts as the fulcrum, under the insertion state, the second portion 520 of the second terminal 500 is brought into contact with the circuit board 700 to regulate an excessive tilt of the main body 200. Specifically, when the main body 200 is tilted relative to the circuit board 700 with the fulcrum portion 252, which acts as the fulcrum, under the insertion state, the second portion 520 of the second terminal 500 is brought into contact with the lower surface 730 of the circuit board 700 to regulate the excessive tilt of the main body 200. More specifically, when the main body 200 is tilted relative to the circuit board 700 with the fulcrum portion 252, which acts as the fulcrum, under the insertion state so that the main body 200 intersects with both the up-down direction and the predetermined direction, the end surface 554 of the lower protrusion 550 of the second portion 520 of the second terminal 500 is hooked onto the lower surface 730 of the circuit board 700 to regulate the excessive tilt of the main body 200.

However, the present invention is not limited thereto. Specifically, when the main body 200 is tilted relative to the circuit board 700 with the fulcrum portion 252, which acts as the fulcrum, under the insertion state, the second portion 420 of the first terminal 400 may be brought into contact with the circuit board 700 to regulate the excessive tilt of the main body 200. In other words, the electrical component 100 should be configured so that, when the main body 200 is tilted relative to the circuit board 700 with the fulcrum portion 252, which acts as the fulcrum, under the insertion state, the second portion 420, 520 of one of the first terminal 400 and the second terminal 500 is brought into contact with the circuit board 700 to regulate the excessive tilt of the main body 200. When the terminals 300 of the electrical component 100 are reflow-soldered on the circuit board 700, hot air is blown onto the main body 200 under the insertion state so that the main body 200 might be tilted relative to the circuit board 700. Even in this case, the aforementioned configuration enables the second portion 420, 520 of one of the first terminal 400 and the second terminal 500 to be brought into contact with the circuit board 700 so that the electrical component 100 is prevented from falling down on the circuit board 700.

Referring to FIGS. 6 and 8, a center of gravity GR of the electrical component 100 is positioned inward in the predetermine direction beyond any of the fulcrum portions 252 when the first portion 410 of the first terminal 400 is brought into contact with the circuit board 700 while the second portion 520 of the second terminal 500 is brought into contact with the circuit board 700 to regulate the excessive tilt of the main body 200. Specifically, the center of gravity GR of the electrical component 100 is positioned inward in the predetermine direction beyond any of the fulcrum portions 252 when the first portion 410 is brought into contact with the circuit board 700 while the second portion 520 is brought into contact with the lower surface 730 of the circuit board 700 to regulate the excessive tilt of the main body 200. More specifically, the center of gravity GR of the electrical component 100 is positioned inward in the predetermine direction beyond any of the fulcrum portions 252 when the first portion 410 is brought into contact with the circuit board 700 while the end surface 554 of the lower protrusion 550 of the second portion 520 is hooked onto the lower surface 730 of the circuit board 700 to regulate the excessive tilt of the main body 200.

However, the present invention is not limited thereto. Specifically, the electrical component 100 should be configured so that the center of gravity GR of the electrical component 100 is positioned inward in the predetermine direction beyond the fulcrum portion 252 when the first portion 410, 510 of one of the first terminal 400 and the second terminal 500 is brought into contact with the circuit board 700 while the second portion 420, 520 of one of the first terminal 400 and the second terminal 500 is brought into contact with the circuit board 700 to regulate the excessive tilt of the main body 200. When the terminals 300 of the electrical component 100 are reflow-soldered on the circuit board 700, hot air is blown onto the main body 200 under the insertion state so that the main body 200 might be tilted relative to the circuit board 700. Even in this case, the aforementioned configuration prevents falling down of the electrical component 100 on the circuit board 700 and enables the electrical component 100 to autonomously return to its original attitude.

Second Embodiment

Figure 12:
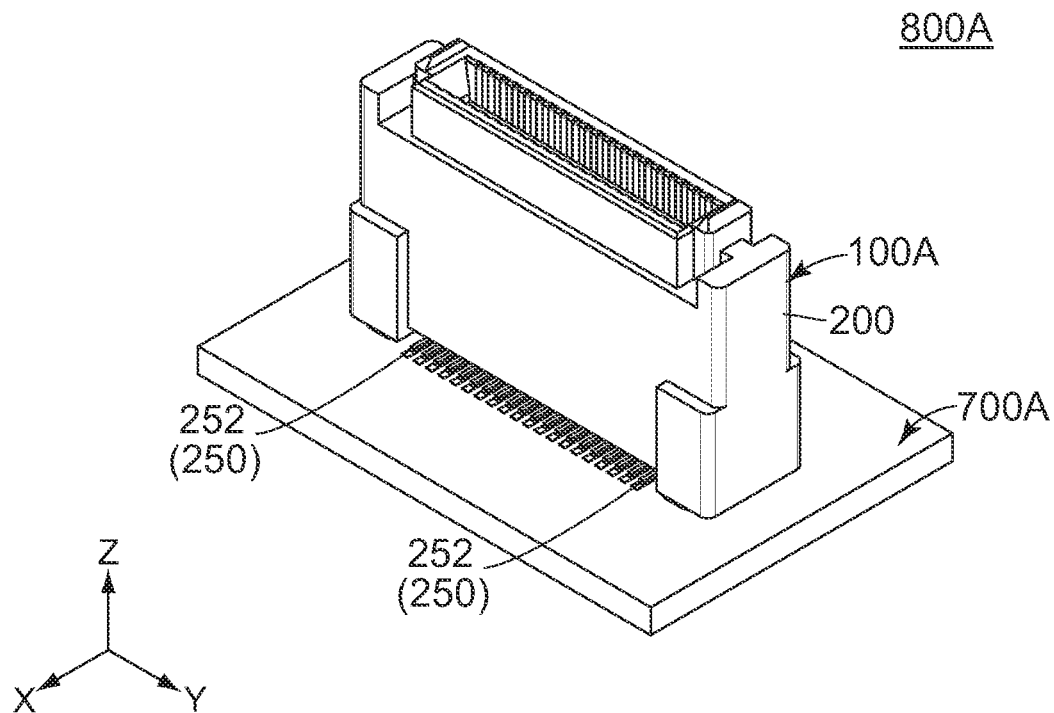
FIG. 12 is an upper, perspective view showing an assembly according to a second embodiment of the present invention. In the figure, terminals are inserted into through-holes, respectively, while none of the terminals are soldered thereto.
Figure 13:
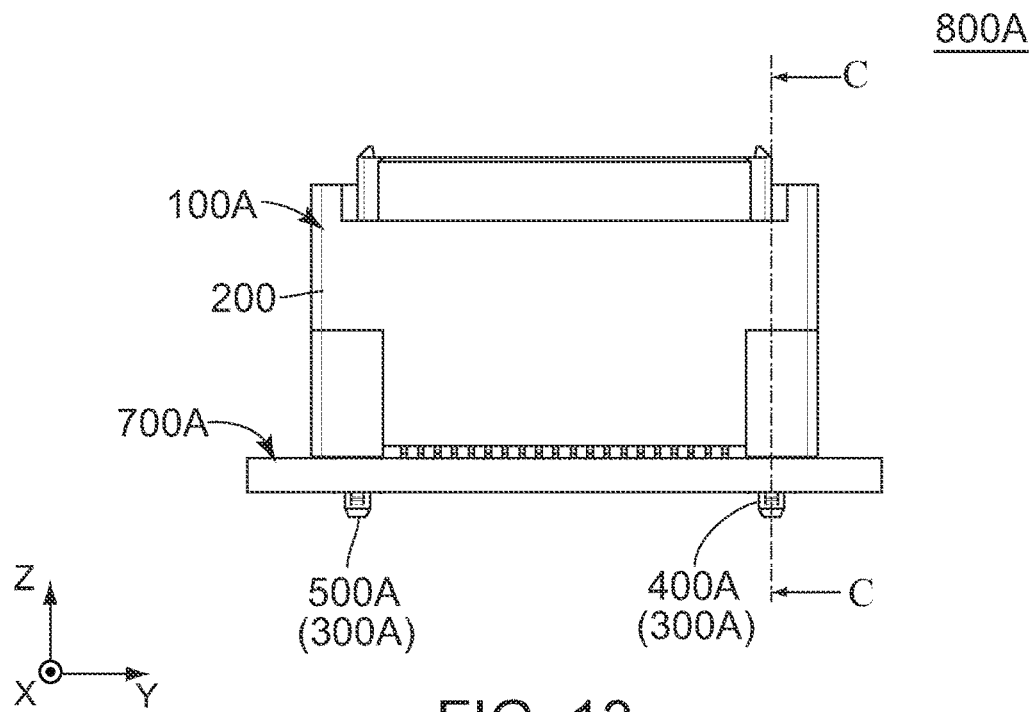
FIG. 13 is a front view showing the assembly of FIG. 12.

As shown in FIG. 12, an assembly 800A according to a second embodiment of the present invention comprises a circuit board 700A and an electrical component 100A. As for directions and orientations in the present embodiment, expressions same as those of the first embodiment will be used hereinbelow.

Figure 14:
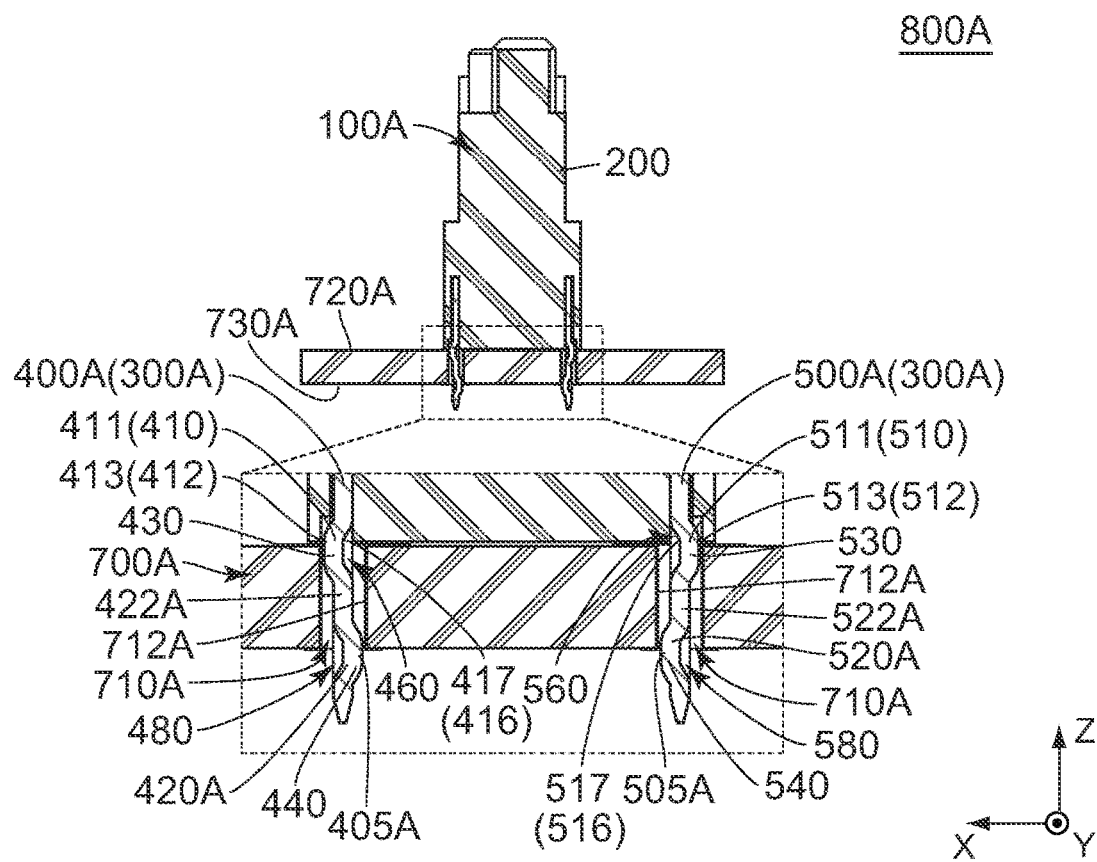
FIG. 14 is a cross-sectional view showing the assembly of FIG. 13, taken along line C-C. In the figure, parts of an electrical component and a circuit board are illustrated enlarged.
Figure 15:
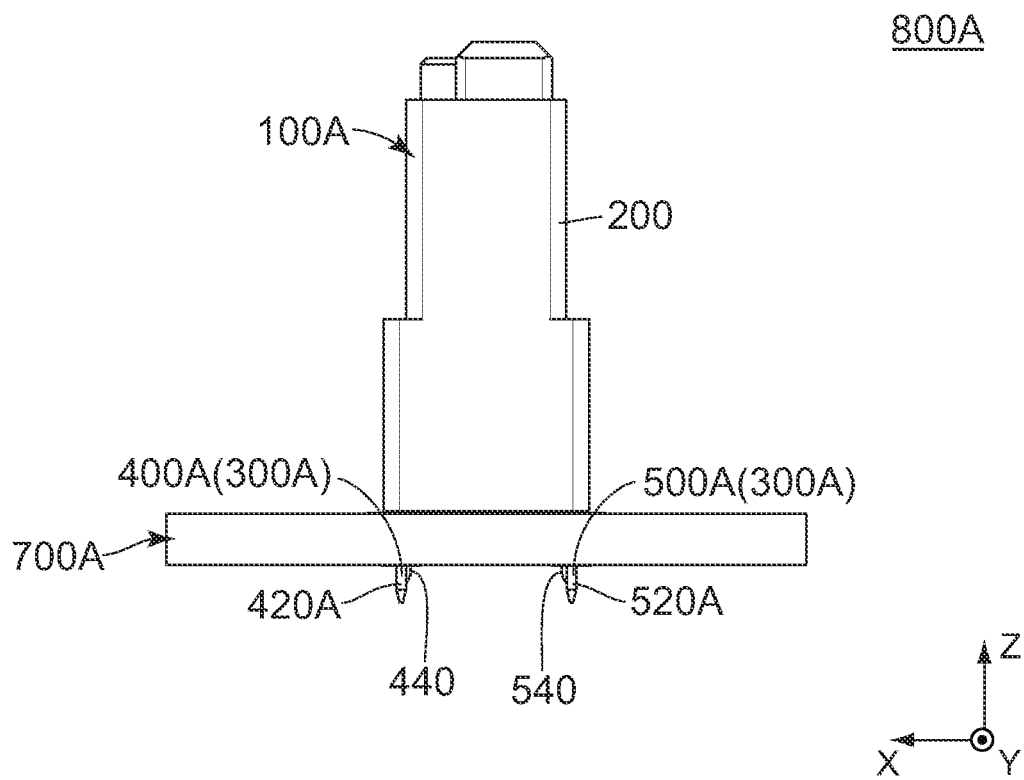
FIG. 15 is a side view showing the assembly of FIG. 12.

As shown in FIG. 14, the circuit board 700A of the present embodiment has a plurality of through-holes 710A, an upper surface 720A and a lower surface 730A. The circuit board 700A of the present embodiment has a structure same as that of the circuit board 700 of the first embodiment as shown in FIG. 2. Accordingly, a detailed explanation thereabout is omitted.

Figure 21:
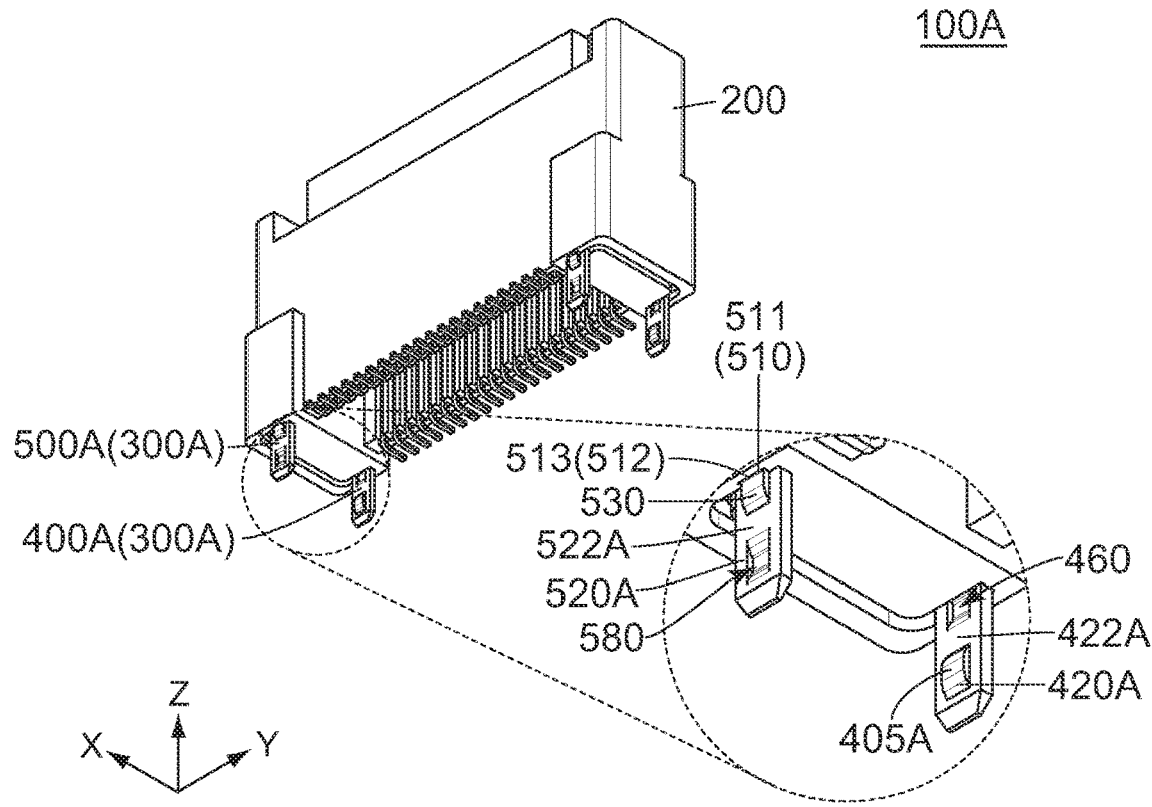
FIG. 21 is a lower, perspective view showing the electrical component of FIG. 19. In the figure, parts of the main body and the terminals are illustrated enlarged.

As shown in FIG. 12, the electrical component 100A of the present embodiment is mounted on the circuit board 700A. The electrical component 100A of the present embodiment is a so-called connector. However, the present invention is not limited thereto. The electrical component 100A may be an electrical component other than the connector. As shown in FIGS. 12 and 21, the electrical component 100A comprises a main body 200, a plurality of terminals 300A and a plurality of additional terminals 250. Specifically, the electrical component 100A comprises the main body 200, four of the terminals 300A, the plurality of additional terminals 250. However, the present invention is not limited thereto. Specifically, the electrical component 100A should comprises the main body 200 and at least two terminals 300A. The main body 200 and the additional terminal 250 of the present embodiment have structures same as those of the main body 200 and the additional terminal 250 of the first embodiment as shown in FIG. 2. Accordingly, a detailed explanation thereabout is omitted.

Referring to FIG. 14, each of the terminals 300A of the present embodiment is made of metal. The terminals 300A are held by the main body 200. When the main body 200 is mounted on the circuit board 700A, the terminals 300A are inserted into the through-holes 710A, respectively, and are soldered thereto. The terminals 300A include first terminals 400A and second terminals 500A. More specifically, the terminals 300A include two of the first terminals 400A and two of the second terminals 500A. The first terminal 400A and one of the second terminals 500A are positioned apart from each other in the predetermined direction. The first terminal 400A and the second terminal 500A have shapes same as each other. The two first terminals 400A correspond to the two second terminals 500A, respectively. Each of the first terminals 400A faces the second terminal 500A corresponding thereto in the predetermined direction. Each of the first terminals 400A is positioned around an outer end of the main body 200 in the predetermined direction. Each of the second terminals 500 is positioned around the outer end of the main body 200 in the predetermined direction. The two first terminals 400A are positioned at opposite ends, respectively, of the main body 200 in the right-left direction. The two second terminals 500A are positioned at the opposite ends, respectively, of the main body 200 in the right-left direction. Referring to FIGS. 14 and 21, in the predetermined direction, each of the terminals 300A has a size smaller than a size of the through-hole 710A corresponding thereto. In the right-left direction, each of the terminals 300A has a size smaller than a size of the through-hole 710A corresponding thereto.

As shown in FIG. 14, each of the first terminals 400A has a first portion 410 and a second portion 420A. Each of the second terminals 500A has a first portion 510 and a second portion 520A. In other words, each of the terminals 300A has the first portion 410, 510 and the second portion 420A, 520A. The first portions 410 and 510 of the present embodiment have structures similar to those of the first portions 410 and 510 of the first embodiment as shown in FIG. 4. Accordingly, a detailed explanation thereabout is omitted.

Referring to FIG. 14, the second portion 420A of the first terminal 400A extends downward in the up-down direction from the first portion 410. Referring to FIGS. 14 and 21, in the predetermined direction, the second portion 420A of the first terminal 400A has a size smaller than the size of the through-hole 710A corresponding thereto. In the right-left direction, the second portion 420A of the first terminal 400A has a size smaller than the size of the through-hole 710A corresponding thereto.

Referring to FIG. 14, the second portion 520A of the second terminal 500A extends downward in the up-down direction from the first portion 510. Referring to FIGS. 14 and 21, in the predetermined direction, the second portion 520A of the second terminal 500A has a size smaller than the size of the through-hole 710A corresponding thereto. In the right-left direction, the second portion 520A of the second terminal 500A has a size smaller than the size of the through-hole 710A corresponding thereto.

As shown in FIG. 14, the second portion 420A has a lower bulge 440 and a coupling portion 422A. The second portion 520A has a lower bulge 540 and a coupling portion 522A. In other words, the second portion 420A, 520A has the lower bulge 440, 540.

As shown in FIG. 14, the lower bulge 440 of the present embodiment is bulged inward in the predetermined direction. The lower bulge 440 is positioned below the coupling portion 422A in the up-down direction. The lower bulge 440 has an innermost portion 405A. The innermost portion 405A is positioned at the innermost location of the first terminal 400A in the predetermined direction. An upper end 417 of an inner edge 416 of the first portion 410 of the first terminal 400A is positioned outward in the predetermined direction beyond the innermost portion 405A.

As shown in FIG. 14, the lower bulge 540 of the present embodiment is bulged inward in the predetermined direction. The lower bulge 540 is positioned below the coupling portion 522A in the up-down direction. The lower bulge 440 of the first terminal 400A and the lower bulge 540 of the second terminal 500A corresponding thereto are positioned at positions same as each other in the up-down direction. The lower bulge 540 has an innermost portion 505A. The innermost portion 505A is positioned at the innermost location of the second terminal 500A in the predetermined direction. An upper end 517 of an inner edge 516 of the first portion 510 of the second terminal 500A is positioned outward in the predetermined direction beyond the innermost portion 505A.

As shown in FIG. 14, the coupling portion 422A of the present embodiment defines an upper end of the second portion 420A in the up-down direction. The coupling portion 422A is coupled with the first portion 410 in the up-down direction. The coupling portion 422A couples the first portion 410 and the lower bulge 440 with each other. Specifically, the coupling portion 422A couples an upper bulge 430 and the lower bulge 440 with each other.

As shown in FIG. 14, the coupling portion 522A of the present embodiment defines an upper end of the second portion 520A in the up-down direction. The coupling portion 522A is coupled with the first portion 510 in the up-down direction. The coupling portion 522A couples the first portion 510 and the lower bulge 540 with each other. Specifically, the coupling portion 522A couples an upper bulge 530 and the lower bulge 540 with each other.

As shown in FIG. 14, the first terminal 400A further has a recess 460 and an additional recess 480. The second terminal 500A further has a recess 560 and an additional recess 580. In other words, the terminal 300A has the recess 460, 560 and the additional recess 480, 580. The recesses 460 and 560 of the present embodiment have structures similar to those of the recesses 460 and 560 of the first embodiment as shown in FIG. 4. Accordingly, a detailed explanation thereabout is omitted.

As shown in FIG. 14, the additional recess 480 is positioned at a position same as a position of the second portion 420A in the up-down direction. The additional recess 480 is positioned below the coupling portion 422A in the up-down direction. The additional recess 480 is positioned outward of the second portion 420A in the predetermined direction. The additional recess 480 is recessed toward the inside of the electrical component 100A in the predetermined direction.

As shown in FIG. 14, the additional recess 580 is positioned outward of the second portion 520A in the predetermined direction. The additional recess 580 is positioned at a position same as a position of the second portion 520A in the up-down direction. The additional recess 580 is positioned below the coupling portion 522A in the up-down direction. The additional recess 580 is recessed toward the inside of the electrical component 100A in the predetermined direction.

Hereinafter, explanation will be made about states of members of the electrical component 100A when the main body 200 is tilted relative to the circuit board 700A by some external factor under an insertion state where each of the terminals 300A is inserted into the through-hole 710A corresponding thereto while none of the terminals 300A are soldered thereto.

Figure 16:
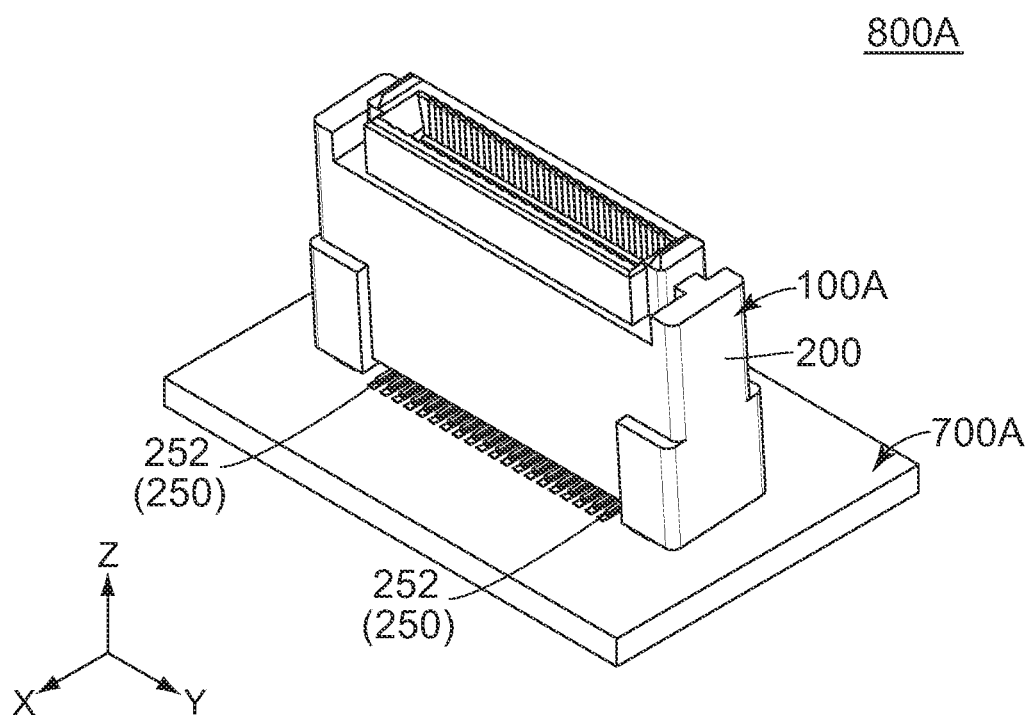
FIG. 16 is another upper, perspective view showing the assembly of FIG. 12, wherein: each of the terminals is inserted into the corresponding through-hole while none of the terminals are soldered thereto; and the electrical component is tilted relative to the circuit board.
Figure 17:
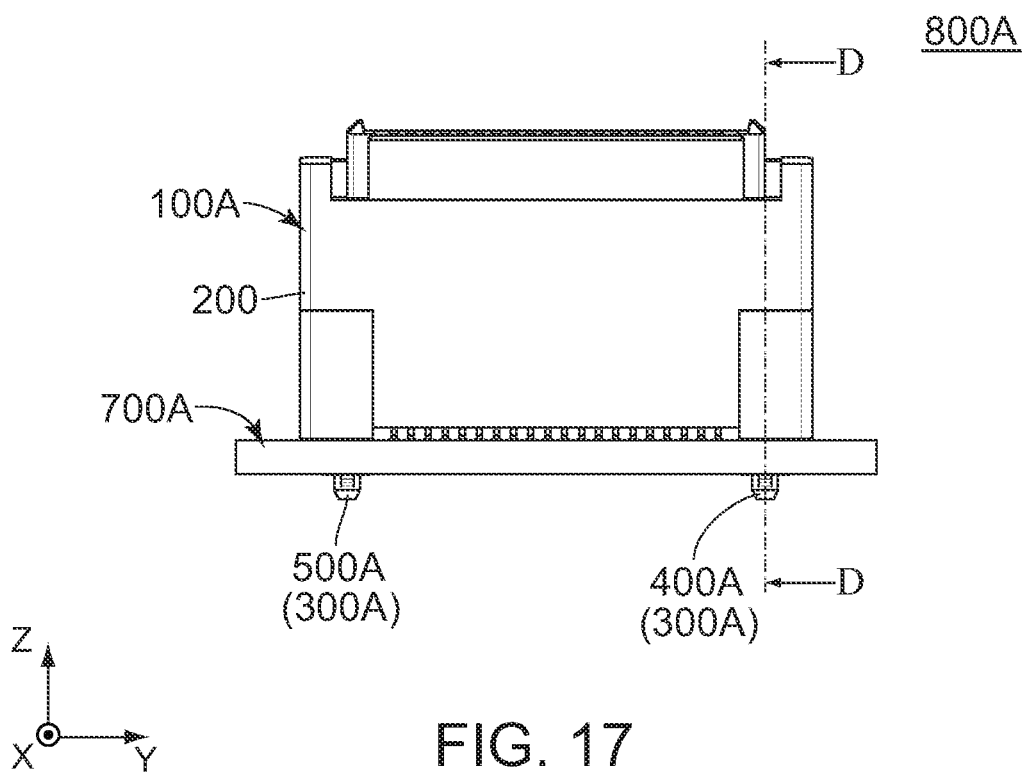
FIG. 17 is a front view showing the assembly of FIG. 16.
Figure 18:
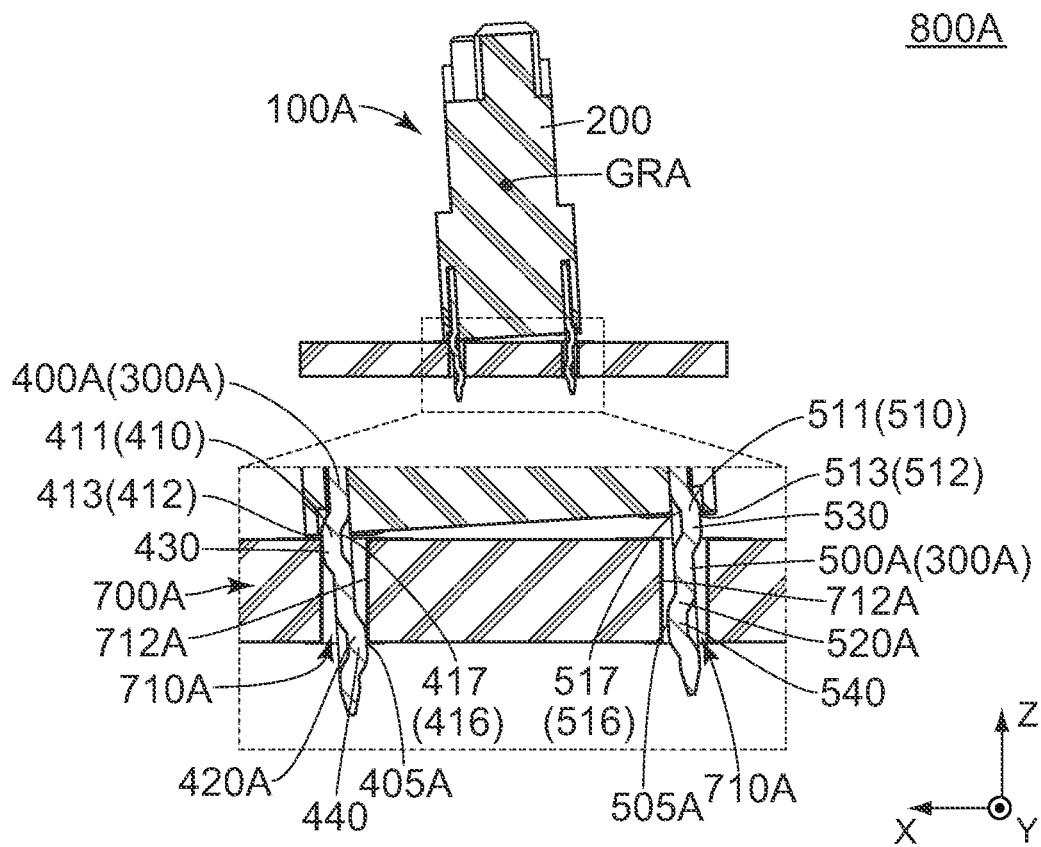
FIG. 18 is a cross-sectional view showing the assembly of FIG. 17, taken along line D-D. In the figure, parts of the electrical component and the circuit board are illustrated enlarged.
Figure 19:
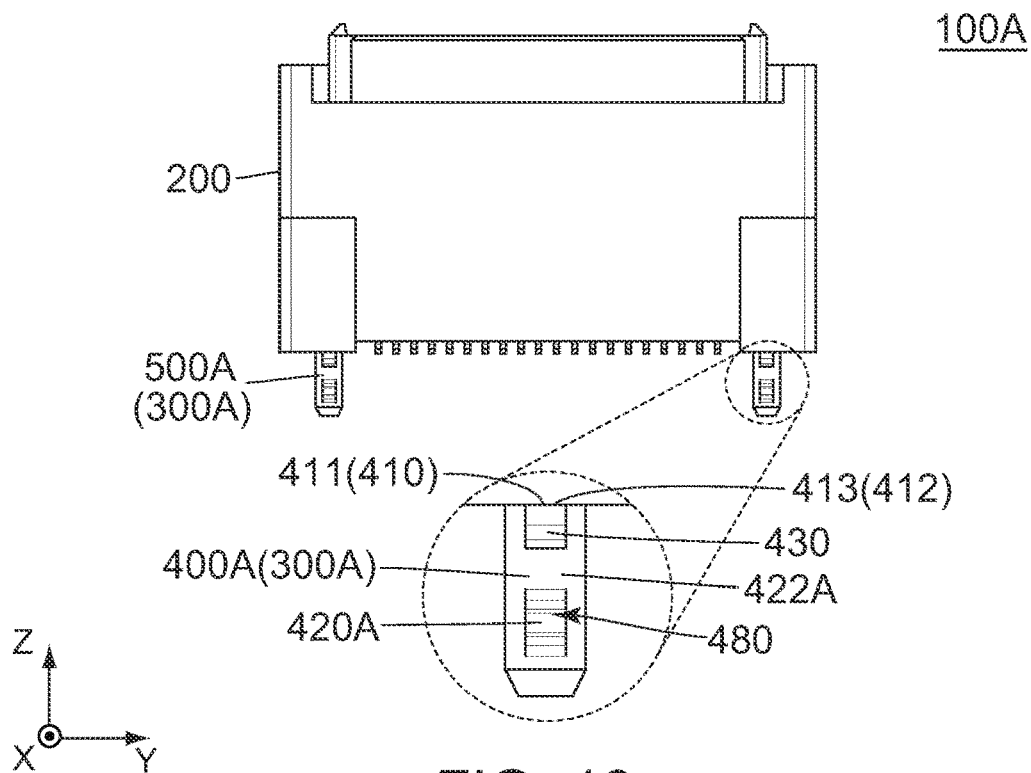
FIG. 19 is a front view showing the electrical component which is included in the assembly of FIG. 12. In the figure, parts of a main body and the terminal are illustrated enlarged.
Figure 20:
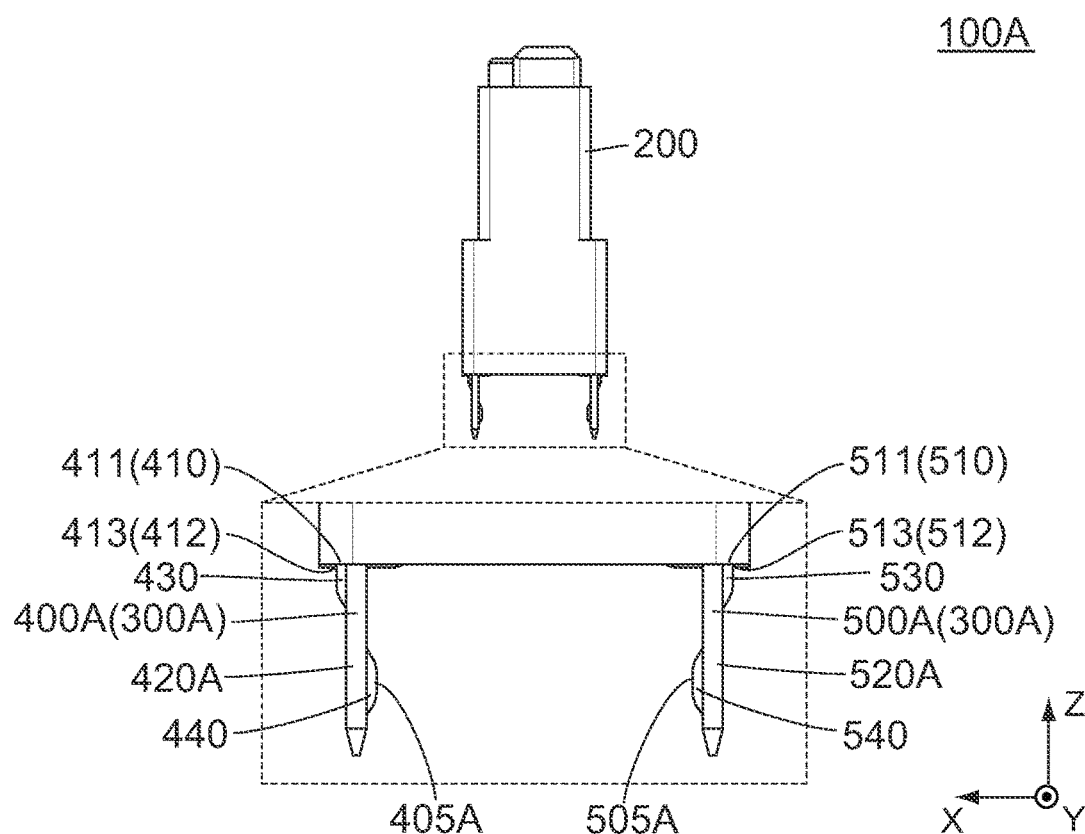
FIG. 20 is a side view showing the electrical component of FIG. 19. In the figure, parts of the main body and the terminals are illustrated enlarged.

Referring to FIGS. 16 and 18, the first portion 410 of the first terminal 400A is brought into contact with the circuit board 700A when the main body 200 is tilted relative to the circuit board 700A with a fulcrum portion 252, which acts as the fulcrum, under the insertion state. More specifically, the first portion 410 is brought into contact with an inner wall 712A of the through-hole 710A when the main body 200 is tilted relative to the circuit board 700A with the fulcrum portion 252, which acts as the fulcrum, under the insertion state so that the main body 200 intersects with both the up-down direction and the predetermined direction. However, the present invention is not limited thereto. Specifically, the first portion 510 of the second terminal 500A may be brought into contact with the circuit board 700A when the main body 200 is tilted relative to the circuit board 700A with the fulcrum portion 252, which acts as the fulcrum, under the insertion state. In other words, the electrical component 100A should be configured so that the first portion 410, 510 of one of the first terminal 400A and the second terminal 500A is brought into contact with the circuit board 700A when the main body 200 is tilted relative to the circuit board 700A with the fulcrum portion 252, which acts as the fulcrum, under the insertion state where each of the terminals 300A is inserted into the through-hole 710A corresponding thereto while none of the terminals 300A are soldered thereto.

Referring to FIGS. 16 and 18, when the main body 200 is tilted relative to the circuit board 700A with the fulcrum portion 252, which acts as the fulcrum, under the insertion state, the second portion 420A of the first terminal 400A is brought into contact with the circuit board 700A to regulate an excessive tilt of the main body 200. Specifically, when the main body 200 is tilted relative to the circuit board 700A with the fulcrum portion 252, which acts as the fulcrum, under the insertion state so that the main body 200 intersects with both the up-down direction and the predetermined direction, the lower bulge 440 of the second portion 420A of the first terminal 400A is brought into contact with the inner wall 712A of the through-hole 710A of the circuit board 700A to regulate the excessive tilt of the main body 200. However, the present invention is not limited thereto. Specifically, when the main body 200 is tilted relative to the circuit board 700A with the fulcrum portion 252, which acts as the fulcrum, under the insertion state, the second portion 520A of the second terminal 500A may be brought into contact with the circuit board 700A to regulate the excessive tilt of the main body 200. In other words, the electrical component 100A should be configured so that, when the main body 200 is tilted relative to the circuit board 700A with the fulcrum portion 252, which acts as the fulcrum, under the insertion state, the second portion 420A, 520A of one of the first terminal 400A and the second terminal 500A is brought into contact with the circuit board 700A to regulate the excessive tilt of the main body 200. When the terminals 300A of the electrical component 100A are reflow-soldered on the circuit board 700A, hot air is blown onto the main body 200 under the insertion state so that the main body 200 might be tilted relative to the circuit board 700A. Even in this case, the aforementioned configuration enables the second portion 420A, 520A of one of the first terminal 400A and the second terminal 500A to be brought into contact with the circuit board 700A so that the electrical component 100A is prevented from falling down on the circuit board 700A.

Referring to FIGS. 16 and 18, a center of gravity GRA of the electrical component 100A is positioned inward in the predetermine direction beyond any of the fulcrum portions 252 when the first portion 410 of the first terminal 400A is brought into contact with the circuit board 700A while the second portion 420A of the first terminal 400A is brought into contact with the circuit board 700A to regulate the excessive tilt of the main body 200. Specifically, the center of gravity GRA of the electrical component 100A is positioned inward in the predetermine direction beyond any of the fulcrum portions 252 when the first portion 410 is brought into contact with the circuit board 700A while the second portion 420A is brought into contact with the inner wall 712A of the through-hole 710A of the circuit board 700A to regulate the excessive tilt of the main body 200.

However, the present invention is not limited thereto. Specifically, the electrical component 100A should be configured so that the center of gravity GRA of the electrical component 100A is positioned inward in the predetermine direction beyond the fulcrum portion 252 when the first portion 410, 510 of one of the first terminal 400A and the second terminal 500A is brought into contact with the circuit board 700A while the second portion 420A, 520A of one of the first terminal 400A and the second terminal 500A is brought into contact with the circuit board 700A to regulate the excessive tilt of the main body 200. When the terminals 300A of the electrical component 100A are reflow-soldered on the circuit board 700A, hot air is blown onto the main body 200 under the insertion state so that the main body 200 might be tilted relative to the circuit board 700A. Even in this case, the aforementioned configuration prevents falling down of the electrical component 100A on the circuit board 700A and enables the electrical component 100A to autonomously return to its original attitude.

Although the second portion 420A, 520A of the present embodiment has the coupling portion 422A. 522A which couples the upper bulge 430, 530 and the lower bulge 440, 540 with each other, the present invention is limited thereto. Specifically, the first terminal 400A may be modified so that the second portion 420A has no coupling portion 422A while the upper bulge 430 and the lower bulge 440 are directly coupled with each other. Similarly, the second terminal 500A may be modified so that the second portion 520A has no coupling portion 522A while the upper bulge 530 and the lower bulge 540 are directly coupled with each other.

Third Embodiment

Figure 22:
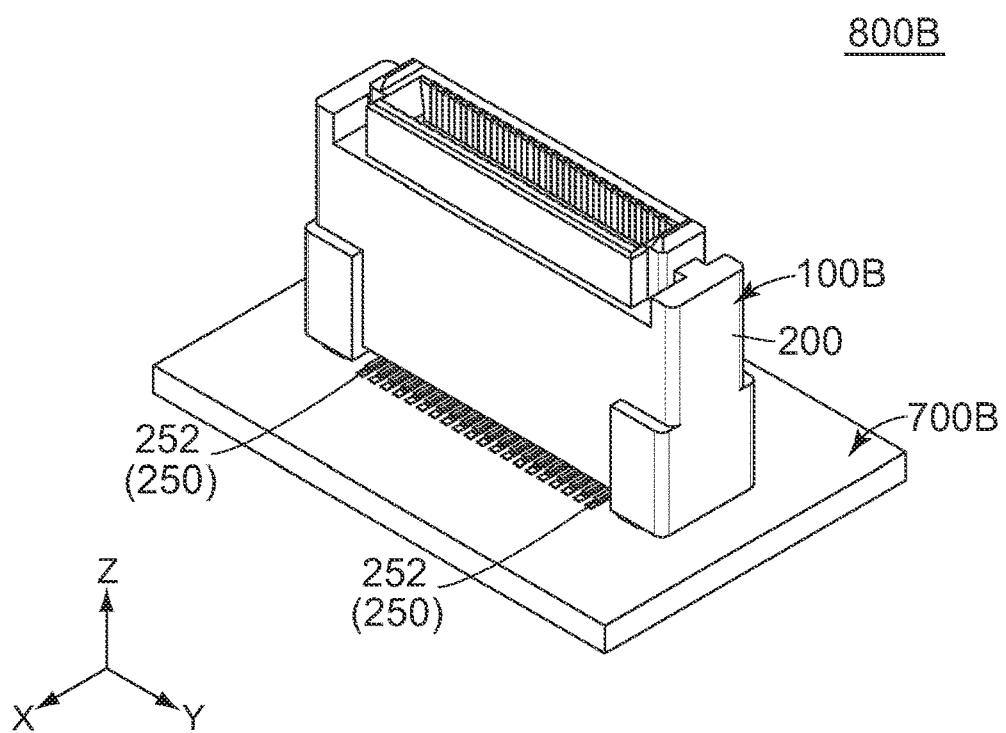
FIG. 22 is an upper, perspective view showing an assembly according to a third embodiment of the present invention. In the figure, terminals are inserted into through-holes, respectively, while none of the terminals are soldered thereto.
Figure 23:
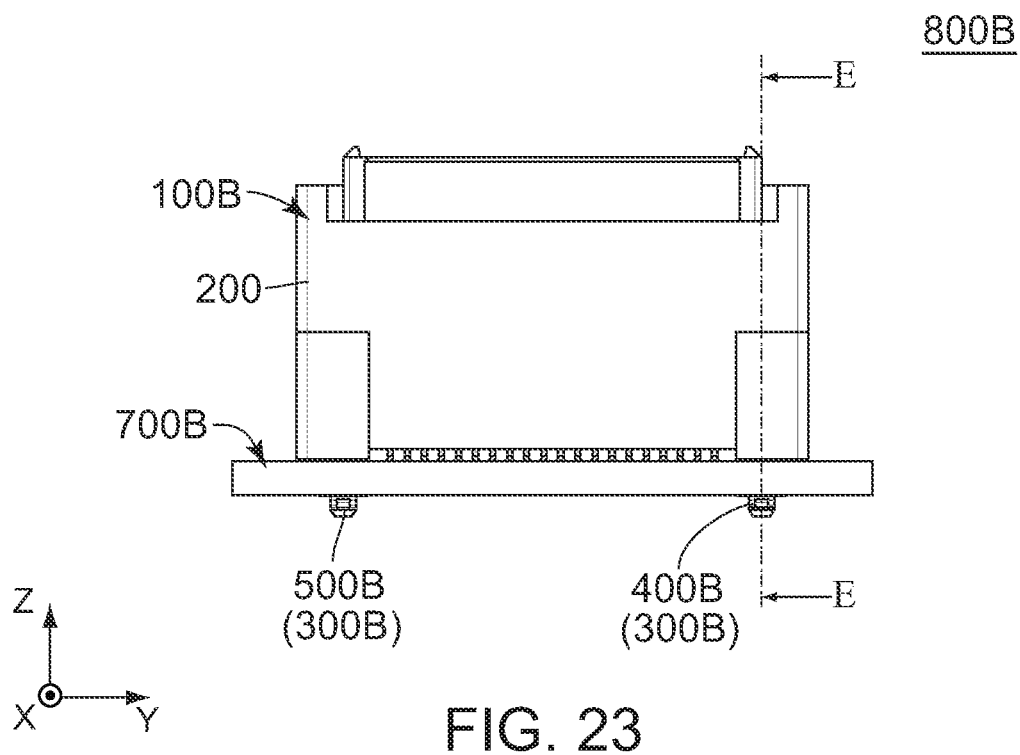
FIG. 23 is a front view showing the assembly of FIG. 22.

As shown in FIG. 22, an assembly 800B according to a third embodiment of the present invention comprises a circuit board 700B and an electrical component 100B.

Figure 24:
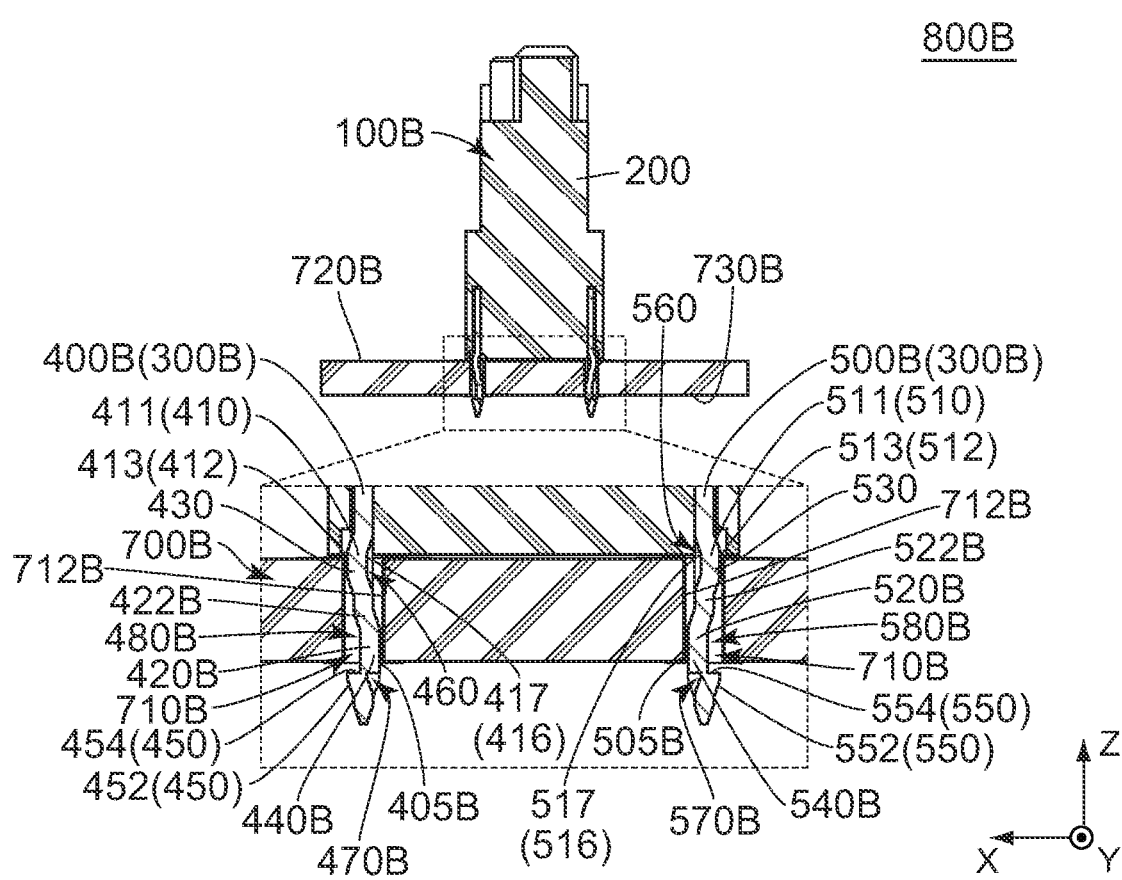
FIG. 24 is a cross-sectional view showing the assembly of FIG. 23, taken along line E-E. In the figure, parts of an electrical component and a circuit board are illustrated enlarged.
Figure 25:
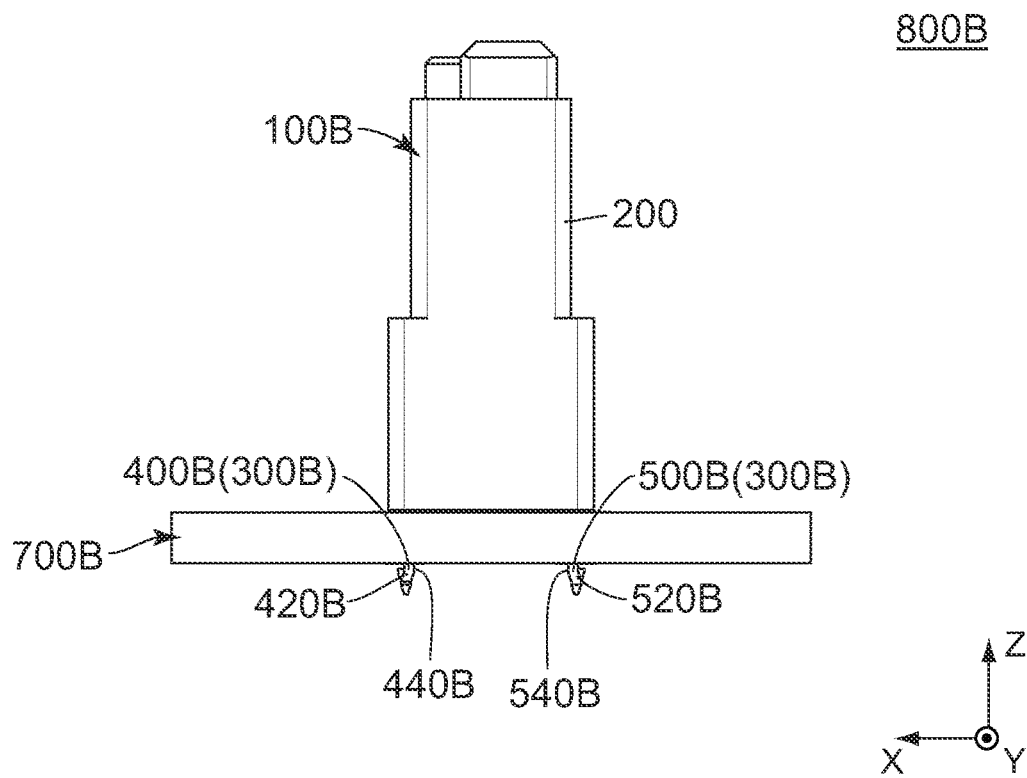
FIG. 25 is a side view showing the assembly of FIG. 22.

As shown in FIG. 24, the circuit board 700B of the present embodiment has a plurality of through-holes 710B, an upper surface 720B and a lower surface 730B. The circuit board 700B of the present embodiment has a structure same as that of the circuit board 700 of the first embodiment as shown in FIG. 2. Accordingly, a detailed explanation thereabout is omitted.

Figure 33:
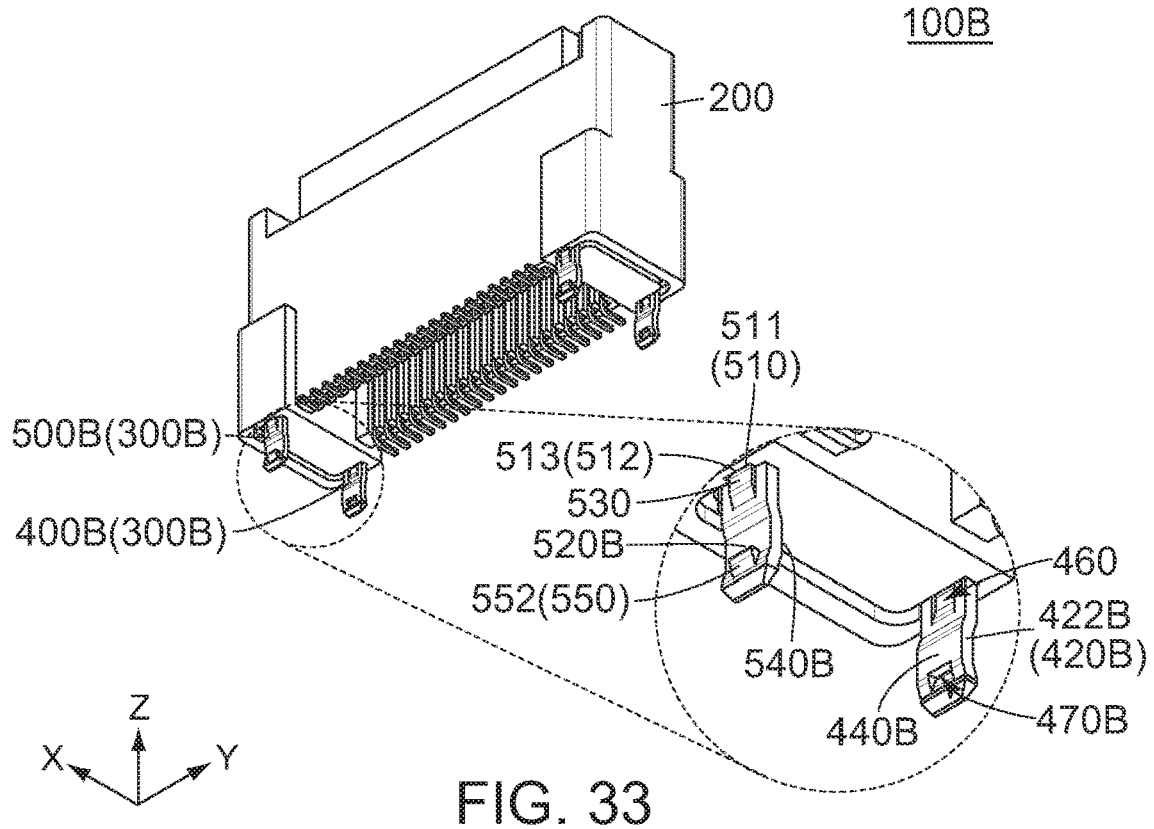
FIG. 33 is a lower, perspective view showing the electrical component of FIG. 31. In the figure, parts of the main body and the terminals are illustrated enlarged.
Figure 34:
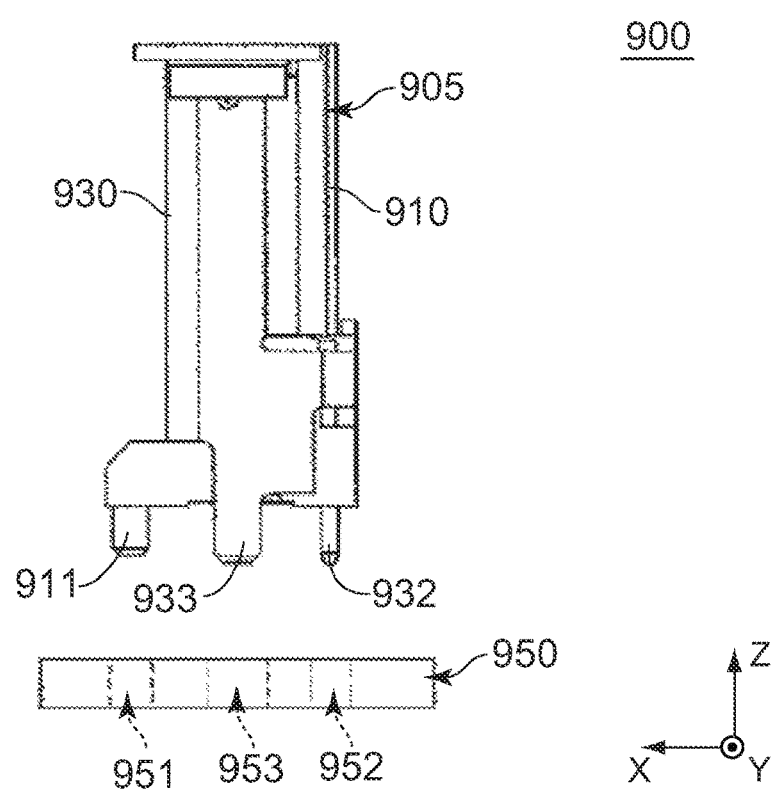
FIG. 34 is a side view showing an assembly of Patent Document 1. In the figure, through-holes of a circuit board are illustrated by dotted line.

As shown in FIG. 22, the electrical component 100B of the present embodiment is mounted on the circuit board 700B. The electrical component 100B of the present embodiment is a so-called connector. However, the present invention is not limited thereto. The electrical component 100B may be an electrical component other than the connector. As shown in FIGS. 22 and 33, the electrical component 100B comprises a main body 200, a plurality of terminals 300B and a plurality of additional terminals 250.

More specifically, the electrical component 100B comprises the main body 200, four of the terminals 300B, the plurality of additional terminals 250. However, the present invention is not limited thereto. Specifically, the electrical component 100B should comprises the main body 200 and at least two terminals 300B. The main body 200 and the additional terminal 250 of the present embodiment have structures same as those of the main body 200 and the additional terminal 250 of the first embodiment as shown in FIG. 2. Accordingly, a detailed explanation thereabout is omitted.

Referring to FIG. 24, each of the terminals 300B of the present embodiment is made of metal. The terminals 300B are held by the main body 200. The terminals 300B are inserted into the through-holes 710B, respectively, and are soldered thereto when the main body 200 is mounted on the circuit board 700B. The terminals 300B include first terminals 400B and second terminals 500B. Specifically, the terminals 300B include two of the first terminals 400B and two of the second terminals 500B. The first terminal 400B and one of the second terminals 500B are positioned apart from each other in the predetermined direction. The first terminal 400B and the second terminal 500B have shapes same as each other. The two first terminals 400B correspond to the two second terminals 500B, respectively. Each of the first terminals 400B faces the second terminal 500B corresponding thereto in the predetermined direction. Each of the first terminals 400B is positioned around an outer end of the main body 200 in the predetermined direction. Each of the second terminals 500B is positioned around the outer end of the main body 200 in the predetermined direction. The two first terminals 400B are positioned at opposite ends, respectively, of the main body 200 in the right-left direction. The two second terminals 500B are positioned at the opposite ends, respectively, of the main body 200 in the right-left direction. Referring to FIGS. 24 and 33, in the predetermined direction, each of the terminals 300B has a size smaller than a size of the through-hole 710B corresponding thereto. In the right-left direction, each of the terminals 300B has a size smaller than a size of the through-hole 710B corresponding thereto.

As shown in FIG. 24, the first terminal 400B has a first portion 410 and a second portion 420B. The second terminal 500B has a first portion 510 and a second portion 520B. In other words, each of the terminals 300B has the first portion 410, 510 and the second portion 420B, 520B. The first portions 410 and 510 of the present embodiment have structures similar to those of the first portions 410 and 510 of the first embodiment as shown in FIG. 4. Accordingly, a detailed explanation thereabout is omitted.

Referring to FIG. 24, the second portion 420B of the first terminal 400B extends downward in the up-down direction from the first portion 410. Referring to FIGS. 24 and 33, in the predetermined direction, the second portion 420B of the first terminal 400B has a size smaller than the size of the through-hole 710B corresponding thereto. In the right-left direction, the second portion 420B of the first terminal 400B has a size smaller than the size of the through-hole 710B corresponding thereto.

As shown in FIG. 24, the second portion 520B of the second terminal 500B extends downward in the up-down direction from the first portion 510. Referring to FIGS. 24 and 33, in the predetermined direction, the second portion 520B of the second terminal 500B has a size smaller than the size of the through-hole 710B corresponding thereto. In the right-left direction, the second portion 520B of the second terminal 500B has a size smaller than the size of the through-hole 710B corresponding thereto.

As shown in FIG. 24, the second portion 420B of the present embodiment has a lower bulge 440B, a lower protrusion 450 and a coupling portion 422B. The second portion 520B has a lower bulge 540B, a lower protrusion 550 and a coupling portion 522B. In other words, the second portion 420B, 520B has the lower bulge 440B, 540B, the lower protrusion 450, 550 and the coupling portion 422B, 522B.

As shown in FIG. 24, the lower bulge 440B of the present embodiment is bulged inward in the predetermined direction. The lower bulge 440B is positioned below the coupling portion 422B in the up-down direction. The lower bulge 440B has an innermost portion 405B. The innermost portion 405B is positioned at the innermost location of the first terminal 400B in the predetermined direction. An upper end 417 of an inner edge 416 of the first portion 410 of the first terminal 400B is positioned outward in the predetermined direction beyond the innermost portion 405B.

As shown in FIG. 24, the lower bulge 540B of the present embodiment is bulged inward in the predetermined direction. The lower bulge 540B is positioned below the coupling portion 522B in the up-down direction. The lower bulge 540B has an innermost portion 505B. The innermost portion 505B is positioned at the innermost location of the second terminal 500B in the predetermined direction. An upper end 517 of an inner edge 516 of the first portion 510 of the second terminal 500B is positioned outward in the predetermined direction beyond the innermost portion 505B.

Figure 32:
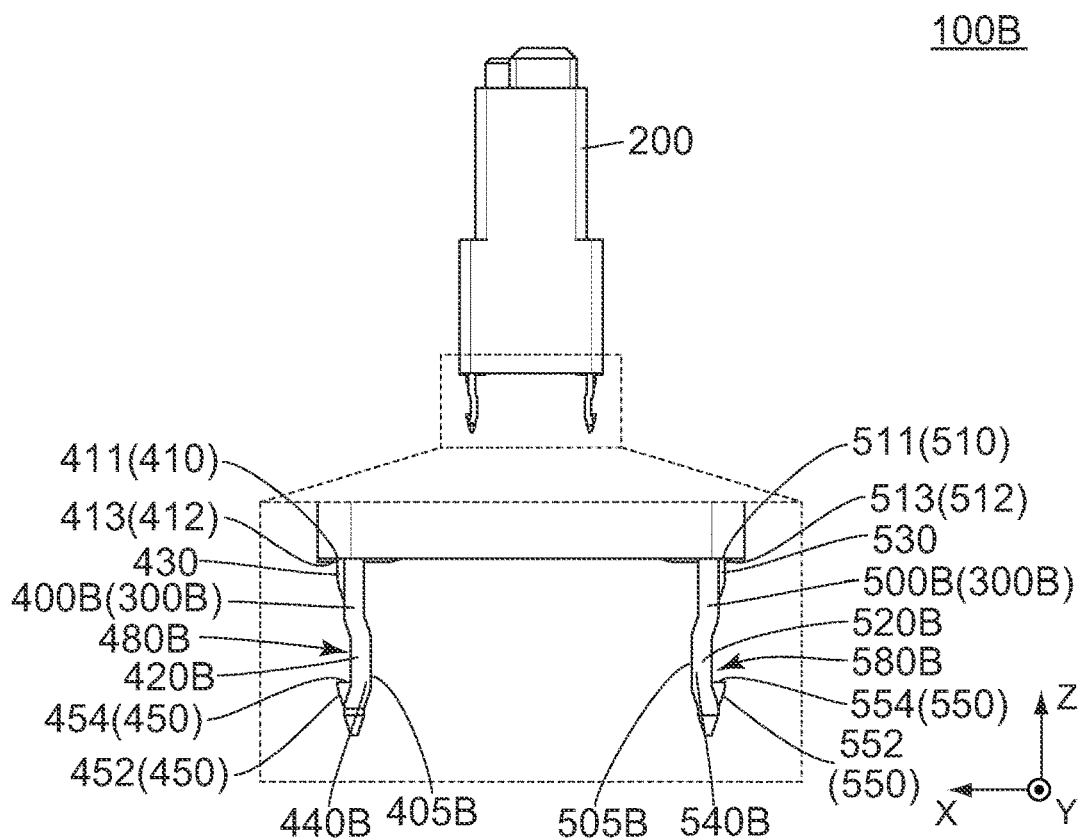
FIG. 32 is a side view showing the electrical component of FIG. 31. In the figure, parts of the main body and the terminals are illustrated enlarged.

As shown in FIG. 32, each of the first terminals 400B of the present embodiment is configured so that the lower protrusion 450 and the lower bulge 440B are positioned at positions different from each other in the up-down direction. Specifically, the lower bulge 440B is positioned above the lower protrusion 450 in the up-down direction. Referring to FIGS. 24 and 32, each of the first terminals 400B has no cavity between the lower protrusion 450 and the lower bulge 440B in the predetermined direction.

As shown in FIG. 32, each of the second terminals 500B of the present embodiment is configured so that the lower protrusion 550 and the lower bulge 540B are positioned at positions different from each other in the up-down direction. Specifically, the lower bulge 540B is positioned above the lower protrusion 550 in the up-down direction. Referring to FIGS. 24 and 32, each of the second terminals 500B has no cavity between the lower protrusion 550 and the lower bulge 540B in the predetermined direction.

As shown in FIG. 24, the lower bulge 440B of the first terminal 400B and the lower bulge 540B of the second terminal 500B corresponding thereto are positioned at positions same as each other in the up-down direction. The lower protrusion 450 of the first terminal 400B and the lower protrusion 550 of the second terminal 500B corresponding thereto are positioned at positions same as each other in the up-down direction.

As shown in FIG. 24, the coupling portion 422B of the present embodiment extends downward in the up-down direction and then extends downward in the up-down direction and inward in the predetermined direction. The coupling portion 422B defines an upper end of the second portion 420B. The coupling portion 422B is coupled with the first portion 410 in the up-down direction. The coupling portion 422B couples the first portion 410 and the lower protrusion 450 with each other.

As shown in FIG. 24, the coupling portion 522B of the present embodiment extends downward in the up-down direction and then extends downward in the up-down direction and inward in the predetermined direction. The coupling portion 522B defines an upper end of the second portion 520B. The coupling portion 522B is coupled with the first portion 510 in the up-down direction. The coupling portion 522B couples the first portion 510 and the lower protrusion 550 with each other.

As shown in FIG. 24, the first terminal 400B further has an upper bulge 430. The second terminal 500B further has an upper bulge 530. In other words, the terminal 300B has the upper bulge 430, 530. The upper bulges 430 and 530 of the present embodiment have structures similar to those of the upper bulges 430 and 530 of the aforementioned first embodiment as shown in FIG. 4. Accordingly, a detailed explanation thereabout is omitted.

As shown in FIG. 24, the first terminal 400B further has a recess 460, a depression 470B and an additional recess 480B. The second terminal 500B further has a recess 560, a depression 570B and an additional recess 580B. In other words, the terminal 300B further has the recess 460, 560, the depression 470B, 570B and the additional recess 480B, 580B. The recesses 460 and 560 of the present embodiment have structures similar to those of the recesses 460 and 560 of the aforementioned first embodiment as shown in FIG. 4. Accordingly, a detailed explanation thereabout is omitted.

As shown in FIG. 24, the depression 470B is positioned at a position same as a position of the lower protrusion 450 in the up-down direction. The depression 470B is positioned inward of the lower protrusion 450 in the predetermined direction. The depression 470B is recessed toward the outside of the electrical component 100B in the predetermined direction.

As shown in FIG. 24, the depression 570B is positioned at a position same as a position of the lower protrusion 550 in the up-down direction. The depression 570B is positioned inward of the lower protrusion 550 in the predetermined direction. The depression 570B is recessed toward the outside of the electrical component 100B in the predetermined direction.

As shown in FIG. 24, the additional recess 480B is positioned below the coupling portion 422B in the up-down direction. The additional recess 480B is positioned above the lower protrusion 450 in the up-down direction. The additional recess 480B is positioned above an end surface 454 in the up-down direction. The additional recess 480B is positioned outward of the second portion 420B in the predetermined direction. The additional recess 480B is recessed toward the inside of the electrical component 100B in the predetermined direction.

As shown in FIG. 24, the additional recess 580B is positioned below the coupling portion 522B in the up-down direction. The additional recess 580B is positioned above the lower protrusion 550 in the up-down direction. The additional recess 580B is positioned above an end surface 554 in the up-down direction. The additional recess 580B is positioned outward of the second portion 520B in the predetermined direction. The additional recess 580B is recessed toward the inside of the electrical component 100B in the predetermined direction.

Hereinafter, explanation will be made about states of members of the electrical component 100B when the main body 200 is tilted relative to the circuit board 700B by some external factor under an insertion state where each of the terminals 300B is inserted into the through-hole 710B corresponding thereto while none of the terminals 300B are soldered thereto.

Figure 26:
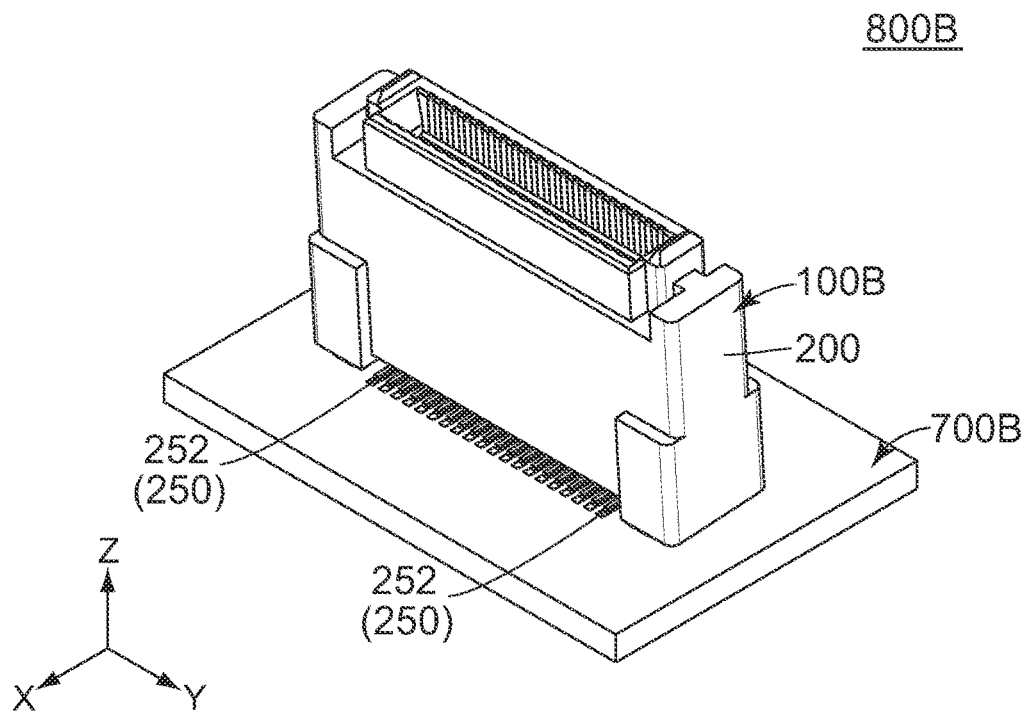
FIG. 26 is another upper, perspective view showing the assembly of FIG. 22, wherein: each of the terminals is inserted into the corresponding through-hole while none of the terminals are soldered thereto; and the electrical component is tilted relative to the circuit board.
Figure 27:
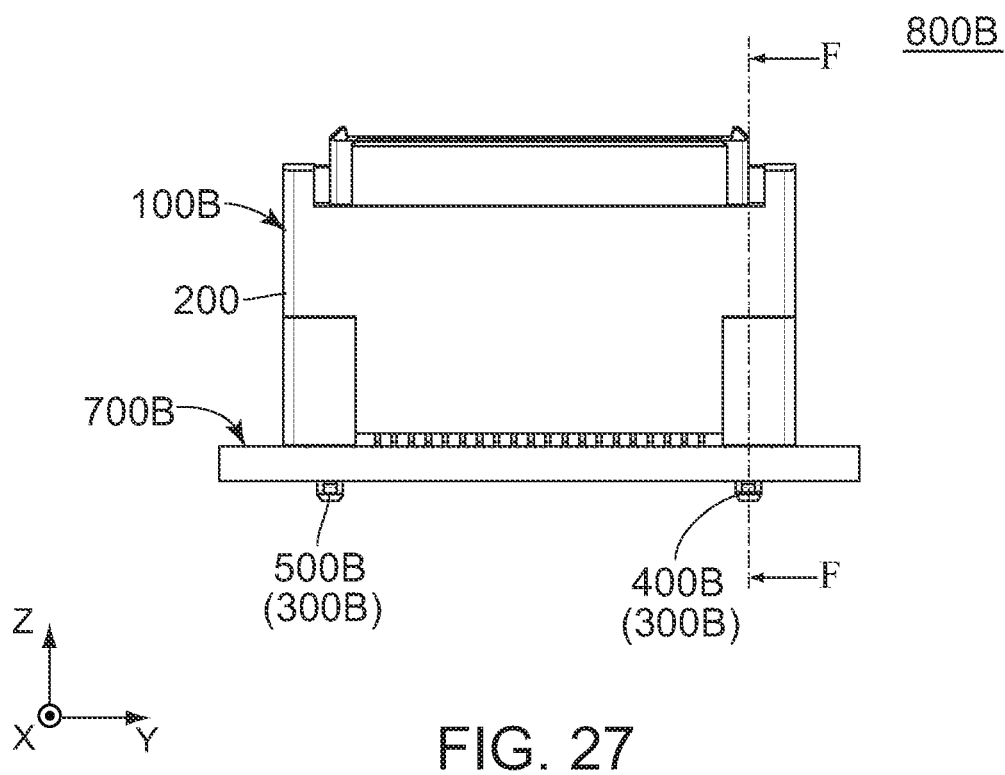
FIG. 27 is a front view showing the assembly of FIG. 26.
Figure 28:
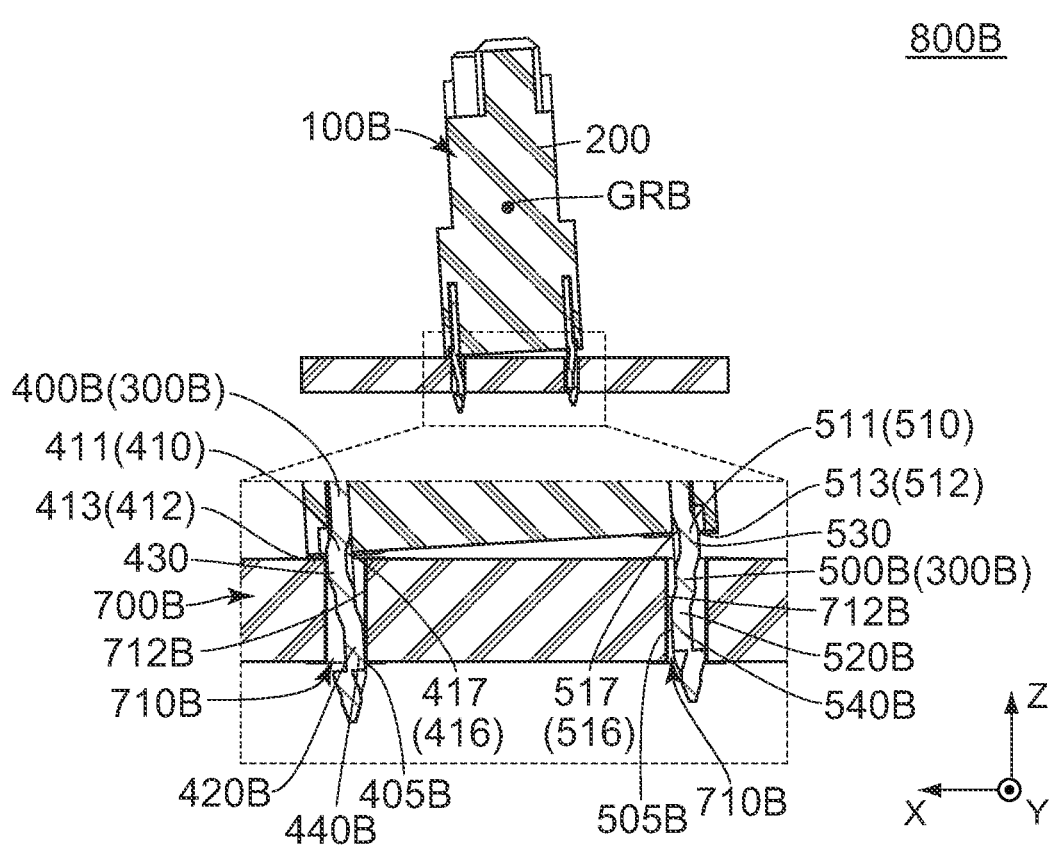
FIG. 28 is a cross-sectional view showing the assembly of FIG. 27, taken along line F-F. In the figure, parts of the electrical component and the circuit board are illustrated enlarged.

Referring to FIGS. 26 and 28, the first portion 410 of the first terminal 400B is brought into contact with the circuit board 700B when the main body 200 is tilted relative to the circuit board 700B with a fulcrum portion 252, which acts as a fulcrum, under the insertion state. More specifically, when the main body 200 is tilted relative to the circuit board 700B with the fulcrum portion 252, which acts as the fulcrum, under the insertion state so that the main body 200 intersects with both the up-down direction and the predetermined direction, the first portion 410 is brought into contact with an inner wall 712B of the through-hole 710B. However, the present invention is not limited thereto. Specifically, the first portion 510 of the second terminal 500B may be brought into contact with the circuit board 700B when the main body 200 is tilted relative to the circuit board 700B with the fulcrum portion 252, which acts as the fulcrum, under the insertion state. In other words, the electrical component 100B should be configured so that the first portion 410, 510 of one of the first terminal 400B and the second terminal 500B is brought into contact with the circuit board 700B when the main body 200 is tilted relative to the circuit board 700B with the fulcrum portion 252, which acts as the fulcrum, under the insertion state where the terminals 300B are inserted into the through-holes 710B, respectively, while none of the terminals 300B are soldered thereto.

Referring to FIGS. 26 and 28, when the main body 200 is tilted relative to the circuit board 700B with the fulcrum portion 252, which acts as the fulcrum, under the insertion state, both of the second portion 420B of the first terminal 400B and the second portion 520B of the second terminal 500B are brought into contact with the circuit board 700B to regulate an excessive tilt of the main body 200. Specifically, when the main body 200 is tilted relative to the circuit board 700B with the fulcrum portion 252, which acts as the fulcrum, under the insertion state so that the main body 200 intersects with both the up-down direction and the predetermined direction, the second portion 420B of the first terminal 400B and the second portion 520B of the second terminal 500B are brought into contact with the inner walls 712B of the through-holes 710B, respectively, of the circuit board 700B to regulate the excessive tilt of the main body 200.

However, the present invention is not limited thereto. Specifically, the electrical component 100B should be configured so that, when the main body 200 is tilted relative to the circuit board 700B with the fulcrum portion 252, which acts as the fulcrum, under the insertion state, the second portion 420B, 520B of at least one of the first terminal 400B and the second terminal 500B is brought into contact with the circuit board 700B to regulate the excessive tilt of the main body 200. When the terminals 300B of the electrical component 100B are reflow-soldered on the circuit board 700B, hot air is blown onto the main body 200 under the insertion state so that the main body 200 might be tilted relative to the circuit board 700B. Even in this case, the aforementioned configuration enables the second portion 420B, 520B of one of the first terminal 400B and the second terminal 500B to be brought into contact with the circuit board 700B so that the electrical component 100B is prevented from falling down on the circuit board 700B.

Referring to FIGS. 26 and 28, a center of gravity GRB of the electrical component 100B is positioned inward in the predetermine direction beyond any of the fulcrum portions 252 when the first portion 410 of the first terminal 400B is brought into contact with the circuit board 700B while both of the second portion 420B of the first terminal 400B and the second portion 520B of the second terminal 500B are brought into contact with the circuit board 700B to regulate the excessive tilt of the main body 200. Specifically, the center of gravity GRB of the electrical component 100B is positioned inward in the predetermine direction beyond any of the fulcrum portions 252 when the first portion 410 is brought into contact with the circuit board 700B while the second portion 420B and second portion 520B are brought into contact with the inner walls 712B of the through-holes 710B, respectively, of the circuit board 700B to regulate the excessive tilt of the main body 200.

However, the present invention is not limited thereto. Specifically, the electrical component 100B should be configured so that the center of gravity GRB of the electrical component 100B is positioned inward in the predetermine direction beyond the fulcrum portion 252 when the first portion 410, 510 of one of the first terminal 400B and the second terminal 500B is brought into contact with the circuit board 700B while the second portion 420B, 520B of at least one of the first terminal 400B and the second terminal 500B is brought into contact with the circuit board 700B to regulate the excessive tilt of the main body 200. When the terminals 300B of the electrical component 100B are reflow-soldered on the circuit board 700B, hot air is blown onto the main body 200 under the insertion state so that the main body 200 might be tilted relative to the circuit board 700B. Even in this case, the aforementioned configuration prevents falling down of the electrical component 100B on the circuit board 700B and enables the electrical component 100B to autonomously return to its original attitude.

The assembly 800B of the aforementioned embodiment may be modified as follows.

Figure 29:
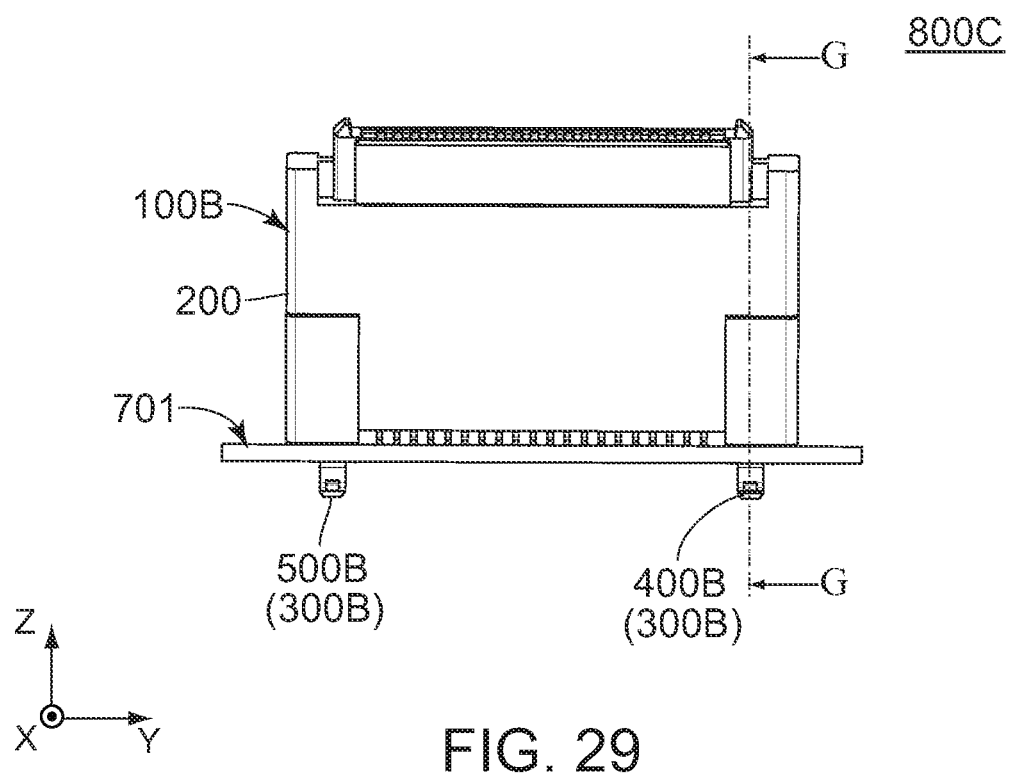
FIG. 29 is a front view showing a state where the electrical component included in the assembly of FIG. 22 is mounted on another circuit board, wherein: the terminals are inserted into through-holes, respectively, while none of the terminals are soldered thereto; and the electrical component is tilted relative to the circuit board more than the electrical component shown in FIG. 26.
Figure 30:
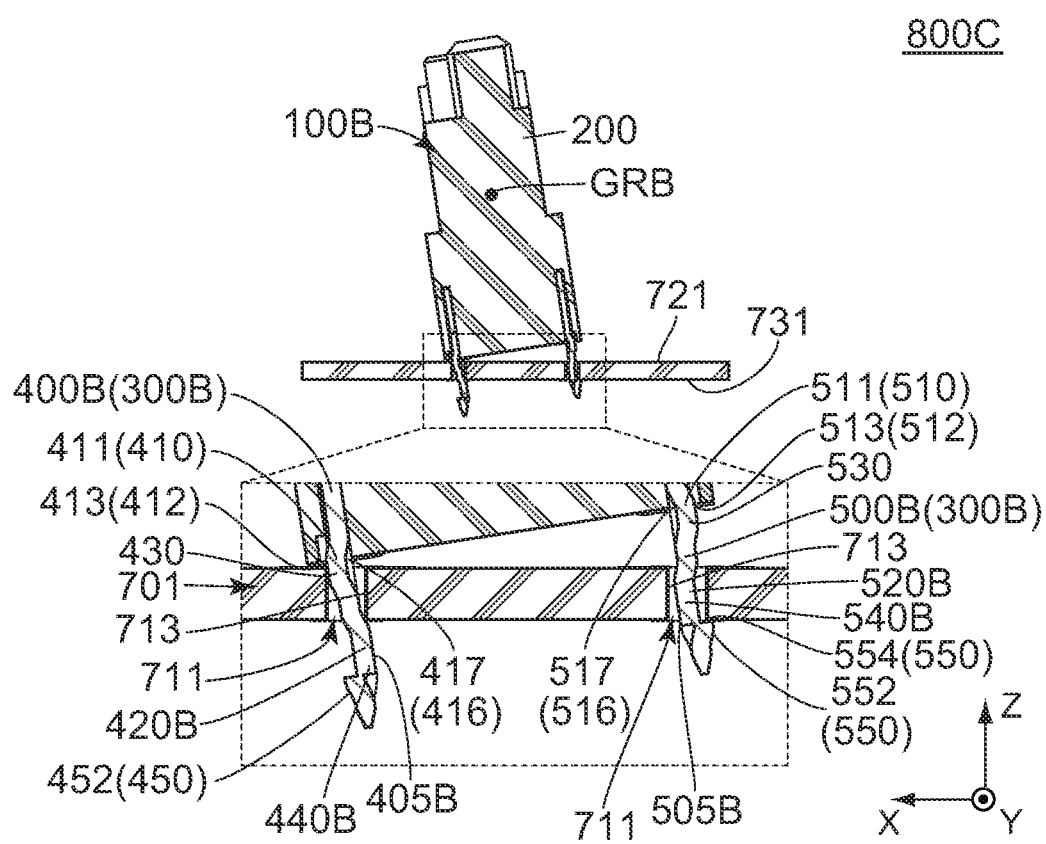
FIG. 30 is a cross-sectional view showing the assembly of FIG. 29, taken along line G-G. In the figure, parts of the electrical component and the circuit board are illustrated enlarged.
Figure 31:
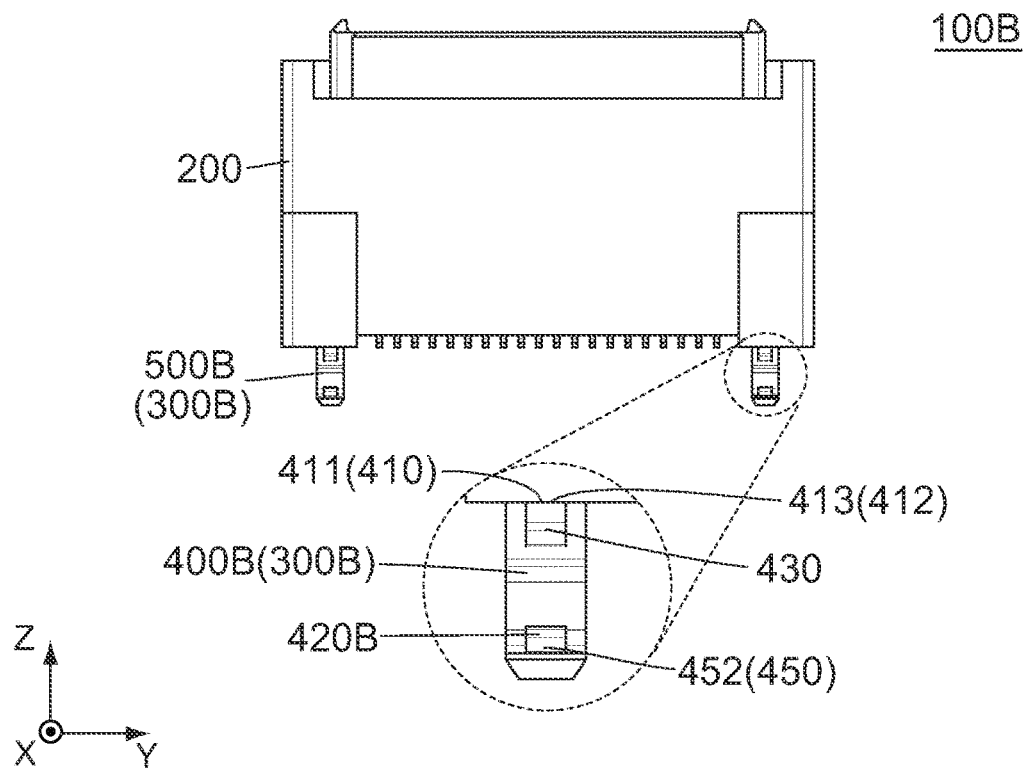
FIG. 31 is a front view showing the electrical component which is included in the assembly of FIG. 22. In the figure, parts of a main body and the terminal are illustrated enlarged.

As shown in FIGS. 29 and 30, an assembly 800C according to a modification comprises a circuit board 701 and an electrical component 100B. Specifically, the circuit board 701 is thinner than the circuit board 700B. The electrical component 100B of the present modification has a structure same as that of the electrical component 100B of the aforementioned embodiment as shown in FIG. 31. Accordingly, a detailed explanation thereabout is omitted.

As shown in FIG. 30, the circuit board 701 of the present modification has a plurality of through-holes 711, an upper surface 721 and a lower surface 731. However, the present invention is not limited thereto. Specifically, the circuit board 701 should have at least two through-holes 711. The through-hole 711, the upper surface 721 and the lower surface 731 of the present modification have structures similar to those of the through-hole 710B, the upper surface 720B and the lower surface 730B of the aforementioned embodiment. Accordingly, a detailed explanation thereabout is omitted.

Referring to FIG. 30, an explanation will be made below about states of members of the electrical component 100B when a main body 200 is tilted relative to the circuit board 701 by some external factor under an insertion state where terminals 300B are inserted into the through-holes 711, respectively, while none of the terminals 300B are soldered thereto.

Referring to FIG. 30, a first portion 410 of a first terminal 400B is brought into contact with the circuit board 701 when the main body 200 is tilted relative to the circuit board 701 with a fulcrum portion 252 shown in FIG. 22, which acts as a fulcrum, under the insertion state. More specifically, when the main body 200 is tilted relative to the circuit board 701 with the fulcrum portion 252, which acts as the fulcrum, under the insertion state so that the main body 200 intersects with both the up-down direction and the predetermined direction, the first portion 410 is brought into contact with an inner wall 713 of the through-hole 711. However, the present invention is not limited thereto. Specifically, a first portion 510 of a second terminal 500B may be brought into contact with the circuit board 701 when the main body 200 is tilted relative to the circuit board 701 with the fulcrum portion 252, which acts as the fulcrum, under the insertion state. In other words, the electrical component 100B should be configured so that the first portion 410, 510 of one of the first terminal 400B and the second terminal 500B is brought into contact with the circuit board 701 when the main body 200 is tilted relative to the circuit board 701 with the fulcrum portion 252, which acts as the fulcrum, under the insertion state where each of the terminals 300B is inserted into the through-hole 711 corresponding thereto while none of the terminals 300B are soldered thereto.

Referring to FIG. 30, when the main body 200 is tilted relative to the circuit board 701 with the fulcrum portion 252 shown in FIG. 22, which acts as the fulcrum, under the insertion state, both of the second portion 420B of the first terminal 400B and the second portion 520B of the second terminal 500B are brought into contact with the circuit board 701 to regulate an excessive tilt of the main body 200. Specifically, when the main body 200 is tilted relative to the circuit board 701 with the fulcrum portion 252, which acts as the fulcrum, under the insertion state, the second portion 420B of the first terminal 400B is brought into contact with the inner wall 713 of the through-hole 711 of the circuit board 701 while the second portion 520B of the second terminal 500B is brought into contact with the lower surface 731 of the circuit board 701. In this case, each of the contact of the second portion 420B with the inner wall 713 and the contact of the second portion 520B with the lower surface 731 regulates the excessive tilt of the main body 200. More specifically, when the main body 200 is tilted relative to the circuit board 701 with the fulcrum portion 252, which acts as the fulcrum, under the insertion state so that the main body 200 intersects with both the up-down direction and the predetermined direction, the second portion 420B of the first terminal 400B is brought into contact with the inner wall 713 of the through-hole 711 of the circuit board 701 while an end surface 554 of a lower protrusion 550 of the second portion 520B of the second terminal 500B is hooked onto the lower surface 731 of the circuit board 701. In this case, each of the contact of the second portion 420B with the inner wall 713 and the hooking of the end surface 554 onto the lower surface 731 regulates the excessive tilt of the main body 200.

However, the present invention is not limited thereto. Specifically, the electrical component 100B should be configured so that, when the main body 200 is tilted relative to the circuit board 701 with the fulcrum portion 252, which acts as the fulcrum, under the insertion state, the second portion 420B, 520B of at least one of the first terminal 400B and the second terminal 500B is brought into contact with the circuit board 701 to regulate the excessive tilt of the main body 200. When the terminals 300B of the electrical component 100B are reflow-soldered on the circuit board 701 which is thinner than the circuit board 700B, hot air is blown onto the main body 200 under the insertion state so that the main body 200 might be tilted relative to the circuit board 701. Even in this case, the aforementioned configuration enables the second portion 420B, 520B of one of the first terminal 400B and the second terminal 500B to be brought into contact with the circuit board 701 so that the electrical component 100B is prevented from falling down on the circuit board 701.

Referring to FIG. 30, when the first portion 410 of the first terminal 400B is brought into contact with the circuit board 701 while the excessive tilt of the main body 200 is regulated by any of the contact of the second portion 420B of the first terminal 400B with the circuit board 701 and the contact of the second portion 520B of the second terminal 500B with the circuit board 701, a center of gravity GRB of the electrical component 100B is positioned inward in the predetermine direction beyond any of the fulcrum portions 252 shown in FIG. 22. Specifically, the center of gravity GRB of the electrical component 100B is positioned inward in the predetermine direction beyond any of the fulcrum portions 252 when the first portion 410 is brought into contact with the circuit board 701 while the excessive tilt of the main body 200 is regulated by any of the contact of the second portion 420B with the inner wall 713 of the through-hole 711 and the contact of the second portion 520B with the lower surface 731 of the circuit board 701. More specifically, the center of gravity GRB of the electrical component 100B is positioned inward in the predetermine direction beyond any of the fulcrum portions 252 when the first portion 410 is brought into contact with the circuit board 701 while the excessive tilt of the main body 200 is regulated by any of the contact of the second portion 420B with the inner wall 713 of the through-hole 711 and the hooking of the end surface 554 of the lower protrusion 550 of the second portion 520B onto the lower surface 731 of the circuit board 701.

However, the present invention is not limited thereto. Specifically, the electrical component 100B should be configured so that the center of gravity GRB of the electrical component 100B is positioned inward in the predetermine direction beyond the fulcrum portion 252 when the first portion 410, 510 of one of the first terminal 400B and the second terminal 500B is brought into contact with the circuit board 701 while the second portion 420B, 520B of at least one of the first terminal 400B and the second terminal 500B is brought into contact with the circuit board 701 to regulate the excessive tilt of the main body 200. When the terminals 300B of the electrical component 100B are reflow-soldered on the circuit board 701 which is thinner than the circuit board 700B, hot air is blown onto the main body 200 under the insertion state so that the main body 200 might be tilted relative to the circuit board 701. Even in this case, the aforementioned configuration prevents falling down of the electrical component 100B on the circuit board 701 and enables the electrical component 100B to autonomously return to its original attitude.

Similar to the electrical component 100A of the second embodiment, the electrical component 100B of the present modification is configured so that, when the electrical component 100B is mounted on a thicker circuit board such as the circuit board 700B, both of the first portion 410 and the second portion 420B of the first terminal 400 are brought into contact with the circuit board. Similar to the electrical component 100 of the first embodiment, the electrical component 100B of the present modification is configured so that, when the electrical component 100B is mounted on a thinner circuit board such as the circuit board 701, the first portion 410 of the first terminal 400B is brought into contact with the circuit board while the lower protrusion 550 of the second portion 520B of the second terminal 500B corresponding thereto is hooked onto the circuit board. Thus, regardless of a thickness of a circuit board on which the electrical component 100B of the present modification is mounted, the electrical component 100B of the present modification reliably prevents an excessive tilt of the main body 200 relative to the circuit board when the main body 200 is tilted relative to the circuit board under an insertion state where the terminals 300B are inserted into through-holes, respectively, of the circuit board while none of the terminals 300B are soldered thereto.

Although the specific explanation about the present invention is made above referring to the embodiments, the present invention is not limited thereto and is susceptible to various modifications and alternative forms. In addition, the above embodiments and variations may also be combined.

Although the electrical component 100, 100A, 100B of the present embodiment further comprises the additional terminals 250, the present invention is not limited thereto. Specifically, the electrical component 100, 100A, 100B may comprise no additional terminal 250. In this case, a lower corner portion of the main body 200 functions as the fulcrum portion 252.

Although the terminal 300 of the first embodiment has the single lower protrusion 450, 550 while the terminal 300B of the third embodiment has the single lower protrusion 450, 550, the present invention is not limited thereto. Specifically, the lower protrusion 450, 550 may consist of protrusions which are adjacent to each other in the up-down direction and each of which protrudes in the same direction. If the lower protrusion 450, 550 consists of two protrusions, an interval of the protrusions in the up-down direction should be shorter than a distance from the upper bulge 430, 530 to the lower protrusion 450, 550. Alternatively, if the lower protrusion 450, 550 consists of three or more protrusions, sum of intervals of the protrusions in the up-down direction should be shorter than a distance from the upper bulge 430, 530 to the lower protrusion 450, 550.

Although each of the lower protrusions 450, 550 of the aforementioned embodiments is the projection which has the peaked shape and is formed by half-punching, the present invention is not limited thereto. Specifically, a vertex of the lower protrusion 450, 550 may have an edge shape. In addition, the lower protrusion 450, 550 may be a lanced portion which is formed by partially cutting and bending the second portion 420, 420B, 520, 520B. The thus-formed lower protrusion 450, 550 can be firmly hooked onto the lower surface 730, 731 of the circuit board 700, 701 when the main body 200 is tilted relative to the circuit board 700, 701 under the insertion state. Accordingly, the thus-formed lower protrusion 450, 550 can more successfully regulate the excessive tilt of the main body 200 relative to the circuit board 700, 701 upon the tilting of the main body 200 relative to the circuit board 700, 701 under the insertion state.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An electrical component mountable on a circuit board having at least two through-holes, wherein:
   the electrical component comprises a main body, a fulcrum portion and at least two terminals;
   the fulcrum portion is brought into contact with the circuit board when the electrical component is mounted on the circuit board;
   when the main body is mounted on the circuit board, the at least two terminals are inserted into the at least two through-holes, respectively, and are soldered thereto;
   the at least two terminals include a first terminal and a second terminal;
   the first terminal and the second terminal are positioned apart from each other in a predetermined direction;
   each of the terminals has a first portion and a second portion;

the first portion has an outer edge and an inner edge in the predetermined direction;

the outer edge of the first portion extends downward in an up-down direction perpendicular to the predetermined direction from the main body and then extends downward in the up-down direction and inward in the predetermined direction;

the outer edge of the first portion has an upper end in the up-down direction;

the upper end of the outer edge of the first portion is positioned at an outermost location of the outer edge of the first portion in the predetermined direction;

the first portion of one of the first terminal and the second terminal is brought into contact with the circuit board when the main body is tilted relative to the circuit board with the fulcrum portion, which acts as a fulcrum, under an insertion state where the terminals are inserted into the through-holes, respectively, while none of the terminals are soldered thereto;

the second portion extends downward in the up-down direction from the first portion; and when the main body is tilted relative to the circuit board with the fulcrum portion, which acts as the fulcrum, under the insertion state, the second portion of one of the first terminal and the second terminal is brought into contact with the circuit board to regulate an excessive tilt of the main body.

2. The electrical component as recited in claim 1, wherein:
the inner edge of the first portion has an upper end in the up-down direction;
the terminal has an innermost portion which is positioned at an innermost location of the terminal in the predetermined direction; and
the upper end of the inner edge of the first portion is positioned outward beyond the innermost portion in the predetermined direction.

3. The electrical component as recited in claim 2, wherein:
the through-hole has an inner wall; and
the upper end of the inner edge of the first portion is spaced apart from the inner wall of the through-hole in the predetermined direction under the insertion state.

4. The electrical component as recited in claim 1, wherein:
the terminal has an upper bulge;
the upper bulge is bulged outward in the predetermined direction;
the first portion has an upper end in the up-down direction; and
the upper bulge forms the upper end of the first portion.

5. The electrical component as recited in claim 1, wherein:
the second portion has a lower bulge; and
the lower bulge is bulged inward in the predetermined direction.

6. The electrical component as recited in claim 1, wherein:
the second portion has a lower protrusion; and
the lower protrusion protrudes outward in the predetermined direction.

7. The electrical component as recited in claim 6, wherein:
the lower protrusion has a guide portion;
the guide portion intersects with both the predetermined direction and the up-down direction; and
the guide portion faces outward in the predetermined direction and downward in the up-down direction.

8. The electrical component as recited in claim 1, wherein:
in the predetermined direction, the first portion of the terminal has a size smaller than a size of the through-hole corresponding thereto;
in a right-left direction perpendicular to both the predetermined direction and the up-down direction, the first portion of the terminal has a size smaller than a size of the through-hole corresponding thereto;
in the perpendicular direction, the second portion of the terminal has a size smaller than the size of the through-hole corresponding thereto; and
in the right-left direction, the second portion of the terminal has a size smaller than the size of the through-hole corresponding thereto.

9. The electrical component as recited in claim 1, wherein a center of gravity of the electrical component is positioned inward in the predetermine direction beyond the fulcrum portion when the first portion is brought into contact with the circuit board while the second portion is brought into contact with the circuit board to regulate the excessive tilt of the main body.

* * * * *